(12) United States Patent
Marauska et al.

(10) Patent No.: US 10,591,320 B2
(45) Date of Patent: Mar. 17, 2020

(54) MAGNETORESISTIVE SENSOR WITH STRAY FIELD CANCELLATION AND SYSTEMS INCORPORATING SAME

(71) Applicant: NXP B.V., Eindhoven (NL)

(72) Inventors: Stephan Marauska, Kaltenkirchen (DE); Jan Przytarski, Hamburg (DE); Jörg Kock, Horst (DE); Edwin Schapendonk, Oss (NL)

(73) Assignee: NXP B.V., Eindhoven (NL)

( * ) Notice: Subject to any disclaimer, the term of this patent is extended or adjusted under 35 U.S.C. 154(b) by 183 days.

(21) Appl. No.: 15/836,975

(22) Filed: Dec. 11, 2017

(65) Prior Publication Data

US 2019/0178684 A1   Jun. 13, 2019

(51) Int. Cl.
| | | |
|---|---|---|
| *G01D 5/244* | (2006.01) | |
| *G01R 33/025* | (2006.01) | |
| *G01R 33/09* | (2006.01) | |
| *G01R 33/00* | (2006.01) | |

(52) U.S. Cl.
CPC ....... *G01D 5/2448* (2013.01); *G01R 33/0005* (2013.01); *G01R 33/0017* (2013.01); *G01R 33/0029* (2013.01); *G01R 33/025* (2013.01); *G01R 33/091* (2013.01); *G01R 33/093* (2013.01); *G01R 33/096* (2013.01); *G01R 33/098* (2013.01)

(58) Field of Classification Search
CPC .. G01D 5/2448; G01R 33/098; G01R 33/096; G01R 33/093; G01R 33/0005; G01R 33/025; G01R 33/0029; G01R 33/0017; G01R 33/091

USPC .................................. 324/207.12; 702/117
See application file for complete search history.

(56) References Cited

U.S. PATENT DOCUMENTS

| | | | |
|---|---|---|---|
| 4,752,733 A | 6/1988 | Petr et al. | |
| 7,084,622 B2 | 8/2006 | Nix | |
| 7,746,065 B2 | 6/2010 | Pastre et al. | |
| 8,818,749 B2* | 8/2014 | Friedrich | G01R 33/0023 |
| | | | 702/117 |
| 2002/0171418 A1 | 11/2002 | Hinz et al. | |
| 2007/0188168 A1* | 8/2007 | Stanley | B60R 21/0136 |
| | | | 324/228 |

(Continued)

FOREIGN PATENT DOCUMENTS

| | | |
|---|---|---|
| EP | 1 728 048 B1 | 8/2011 |
| WO | WO-2015/058733 A1 | 4/2015 |

*Primary Examiner* — Farhana A Hoque
(74) *Attorney, Agent, or Firm* — Charlene R. Jacobsen

(57) ABSTRACT

A system includes a magnetic sense element for detecting an external magnetic field along a sensing axis and a magnetic field source proximate the magnetic sense element for providing an auxiliary magnetic field along the sensing axis. The magnetic sense element produces a first output signal having a magnetic field signal component, responsive to the external magnetic field, that is modulated by an auxiliary magnetic field signal component responsive to the auxiliary magnetic field. A processing circuit identifies from the first output signal an influence of a magnetic interference field on the auxiliary magnetic field signal component, the magnetic interference field being directed along a non-sensing axis of the magnetic sense element, and applies a correction factor to the magnetic field signal component to produce a second output signal in which the influence of the magnetic interference field is substantially removed.

17 Claims, 9 Drawing Sheets

(56) References Cited

U.S. PATENT DOCUMENTS

2016/0320462 A1 11/2016 Mather et al.
2017/0089987 A1 3/2017 Monreal et al.

* cited by examiner

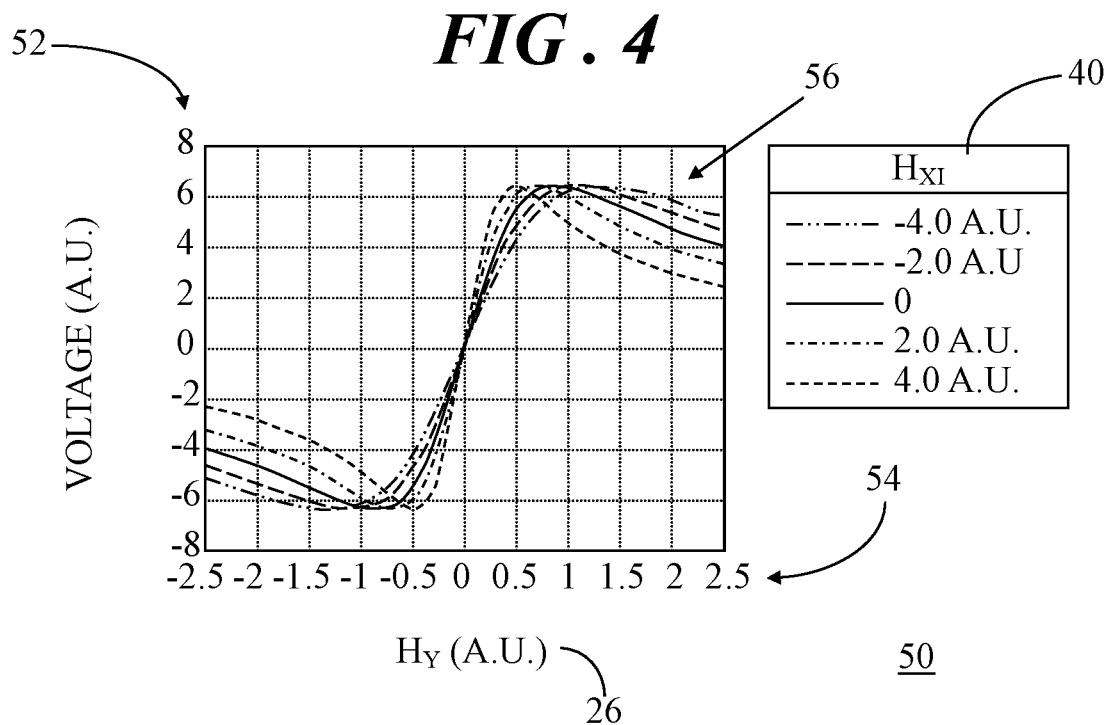
FIG. 4
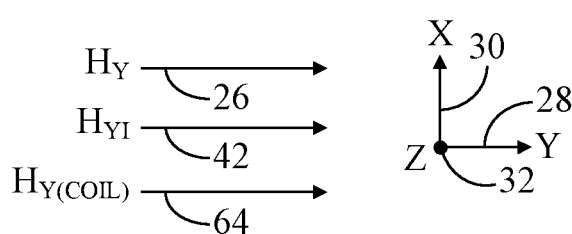
FIG. 5
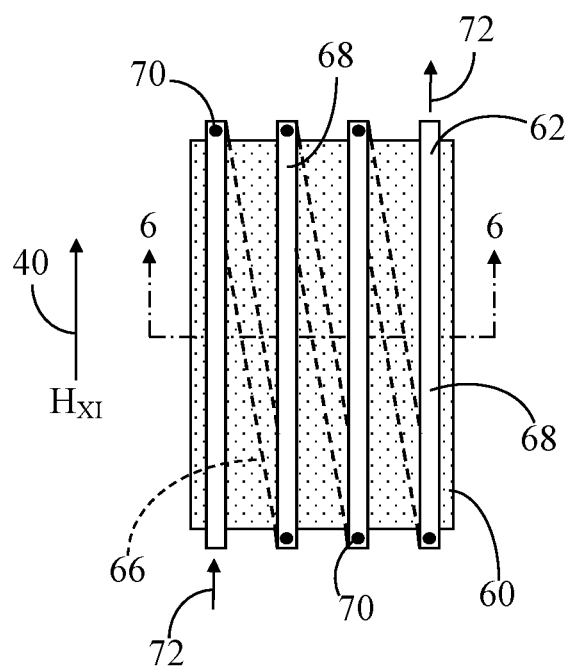
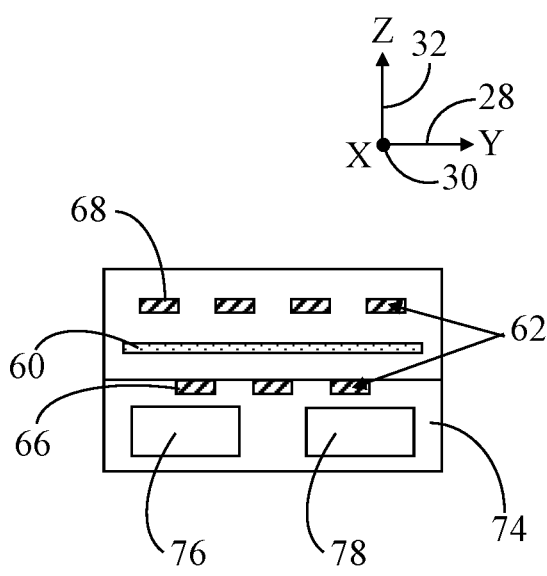
FIG. 6

10,591,320 B2

MAGNETORESISTIVE SENSOR WITH STRAY FIELD CANCELLATION AND SYSTEMS INCORPORATING SAME

TECHNICAL FIELD OF THE INVENTION

The present invention relates generally to magnetoresistive sensors. More specifically, the present invention relates to magnetoresistive sensors and systems incorporating the magnetoresistive sensors for measuring magnetic fields while substantially cancelling stray magnetic fields along one or more axes.

BACKGROUND OF THE INVENTION

Magnetic field sensor systems are utilized in a variety of commercial, industrial, and automotive applications to measure magnetic fields for purposes of speed and direction sensing, rotation angle sensing, proximity sensing, and the like. A magnetoresistive sensor can be sensitive to interference magnetic fields, also known as stray magnetic fields. A stray magnetic field along a non-sensing axis of a magnetic field sensor may change the sensitivity and linearity range of the sensor, thus negatively affecting the magnetic field detection quality. Additionally, a stray magnetic field along a sensing axis of a magnetic field sensor may additionally introduce an error component (e.g., a voltage shift) in the output signal of the sensor.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

FIG. 4 of an example of an output voltage versus an external magnetic field along a sensing axis and its dependence on the field strength of non-sensing axis stray magnetic fields;

FIG. 5 shows a top view of a magnetic sense element that includes a magnetic field source in accordance with an embodiment;

FIG. 6 shows a side sectional view of the magnetic sense element and magnetic field source along section lines 6-6 of FIG. 5

DETAILED DESCRIPTION

Figure 1:
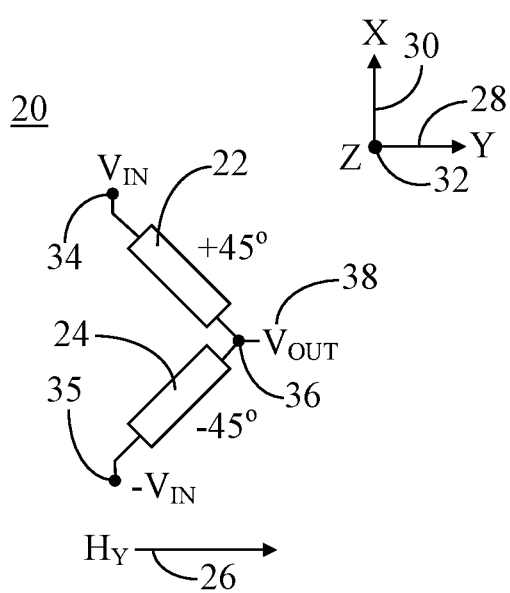
FIG. 1 depicts, in a simplified and representative form, a half bridge structure of magnetic sense elements.

In overview, the present disclosure concerns magnetic field sensors and systems incorporating the magnetic field sensors for measuring magnetic fields while substantially cancelling stray magnetic fields along one or more axes. More particularly, a system includes one or more magnetic field sense elements located in proximity to one or more magnetic field sources, such as a coil structure. The magnetic field source is configured to provide a periodically varying auxiliary magnetic field along the sensing axis of the magnetic field sensor. The periodically varying auxiliary magnetic field thus leads to a periodically varying electrical voltage (or current) response of the magnetic field sensor. The periodically varying electrical voltage (or current) response changes from an expected value depending upon the field strength of a stray magnetic field along a non-sensing axis. Accordingly, the periodically varying auxiliary magnetic field can be used to produce an auxiliary magnetic field signal component that can, in turn, be used to determine the field strength of a homogeneous (i.e., uniform) stray magnetic field along a non-sensing axis. Knowledge of this field strength can be used to counteract, or otherwise cancel, an adverse signal contribution resulting from the stray magnetic field along a non-sensing axis in order to effectively reduce the number of sensitive axes to produce a single axis magnetoresistive sense element. The magnetic sense element along with magnetic field source (yielding a single axis magnetoresistive sense element) may be incorporated in a gradient unit approach which enables cancellation of an adverse signal contribution resulting from a homogeneous (i.e., uniform) stray magnetic field along the sensing axis. Thus, a uniaxial (i.e., single-axis) magnetic sense element may effectively be achieved. One or more magnetic field sense elements with one or more magnetic field sources can be implemented in various system configurations for purposes of speed and direction sensing, rotation angle sensing, proximity sensing, and the like.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Referring to FIG. 1, FIG. 1 depicts, in a simplified and representative form, a half-bridge magnetic sensor structure 20 that includes a first magnetic sense element 22 and a second magnetic sensor element 24. Each of first and second magnetic sense elements 22, 24 is configured to detect, i.e., sense, an external magnetic field, represented by an arrow 26 oriented in a left-to-right direction on the page. In this example, external magnetic field 26, is oriented substantially parallel to a Y-axis 28 within a three-dimensional coordinate system that also includes an X-axis 30 oriented in an up-down direction on the page and a Z-axis 32 oriented into and out of the page. Thus, external magnetic field 26 may be referred to as $H_Y$ external magnetic field 26 herein.

First and second magnetic sense elements 22, 24 may be anisotropic magnetoresistive (AMR) sense elements capable of changing the value of their electrical resistance in response to an externally-applied magnetic field. For example, first magnetic sense element 22 may include permalloy ($N_{180}Fe_{20}$) stripes that are oriented positive forty-five degrees relative to a direction of external magnetic field 26 and second magnetic sense element 24 may include permalloy stripes that are oriented negative forty-five degrees relative to the direction of external magnetic field 26. The orientation of the stripes may enable maximum sensitivity and quasi linear response for small magnetic fields of up to a few kiloamperes per meter (kA/m) of first and second magnetic sense elements 22, 24 to external magnetic field 26. However, other angular orientations are also possible. Although AMR sense elements are mentioned herein. Alternative embodiments may include other magnetoresistive sensor technologies, such as giant magnetoresistive (GMR) sense elements, tunnel magnetoresistive (TMR) sense elements, and so forth.

Connection terminals for half-bridge magnetic sensor structure 20 include a $V_{IN}$ terminal 34, a $-V_{IN}$ terminal 35, and a $V_{OUT}$ terminal 36. $V_{IN}$ terminal 34 may be connected to a positive output terminal of a regulated internal voltage supply (not shown) and $-V_{IN}$ terminal 35 may be connected to a negative output terminal of the regulated internal voltage supply or to a system ground. $V_{OUT}$ terminal 36 is an output terminal for half-bridge magnetic sensor structure 20 at which a first output signal 38 produced by half-bridge magnetic sensor structure 20 of first and second magnetic sense elements 22, 24 in response to external magnetic field 26 is available for further processing.

Figure 2:
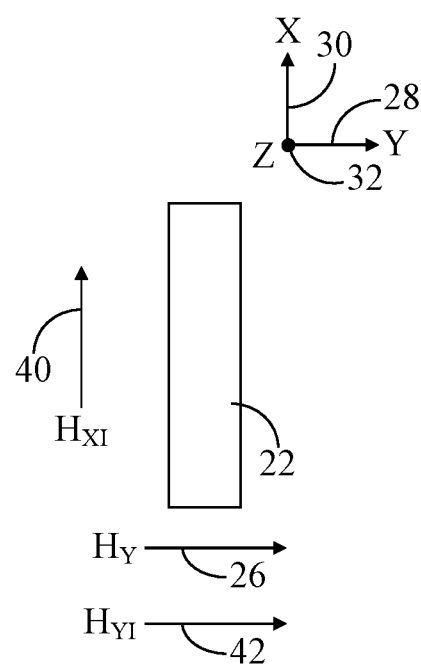
FIG. 2 shows a simplified top view of a single magnetic sense element.

FIG. 2 shows a simplified top view of a single magnetic sense element. In this example, FIG. 2 shows first magnetic sense element 22. The following discussion applies to second magnetic sense element 24 (FIG. 1) as well. As mentioned above, first magnetic sense element 22 is configured to detect, i.e., sense, external magnetic field 26 along a sensing axis, which in this example is Y-axis 28. However, first magnetic sense element 22 may also be subject to interference from stray magnetic fields along the sensing axis, i.e., Y-axis 28, and a non-sensing axis parallel to a plane of the sensor, i.e., X-axis 30. In general, first magnetic sense element 22 is a magnetoresistive sensor having a very thin film or layer (e.g., a few nanometer up to a ten nanometer thickness in some applications) along the Z-axis. This very thin layer leads to a strong layer internal anisotropy field. This field generally prevents rotation of the magnetization into the Z-direction. Thus, magnetoresistive sensors are relatively insensitive to stray magnetic fields along Z-axis 32, and are therefore not considered herein.

In this example, a stray magnetic field oriented along the non-sensing X-axis 30 is represented by an arrow 40 directed upward on the page and is labeled $H_{XT}$. Hence, this stray magnetic field may be referred to as non-sensing axis stray magnetic field 40. Similarly, a stray magnetic field oriented along the sensing Y-axis 28 is represented by an arrow 42 directed rightward on the page and is labeled $H_{YT}$. Hence, this stray magnetic field may be referred to as sensing axis stray magnetic field 42. Non-sensing and sensing axis stray magnetic fields 40, 42 can corrupt first output signal 38 (FIG. 1) or reduce the signal-to-noise ratio (SNR) to unacceptable levels. This can have significant impact on safety-critical designs in, for example, the automotive industry.

Figure 3:
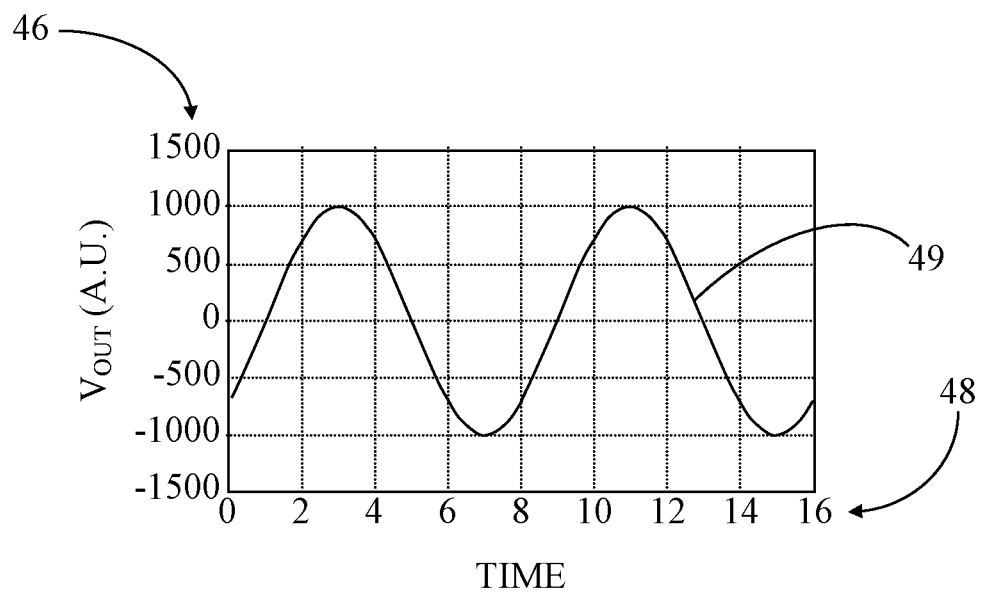
FIG. 3 shows a graph of an example of an output voltage versus time for of voltage response with respect to a varying external magnetic field signal.

FIG. 3 shows a graph 44 of an example of an output voltage 46 versus time 48 of a voltage response 49 with respect to a varying external magnetic field. The depiction of voltage response 49 as sinusoidally varying in FIG. 3 is an ideal or representative signal that can be distorted by non-sensing and sensing axis stray magnetic fields 40, 42.

FIG. 4 shows a graph 50 of an example of an output voltage 52 versus external magnetic field 26 (FIG. 2) along sensing axis 28. More particularly, graph 50 provides an array of characteristic curves 56 exemplifying a dependence of sensed external magnetic field 26 on non-sensing axis stray magnetic field 40. In graph 50, output voltage 52, a field strength 54, and various field strengths of non-sensing axis stray magnetic field 40 are shown in arbitrary units (A.U.) for simplicity. A solid curve within the array of characteristic curves 56 represents a condition in which non-sensing axis stray magnetic field 40 is equal to zero (i.e., there is no non-sensing axis stray magnetic field 40). The remaining curves within the array of characteristic curves 56 represent the variance (i.e., distortion) when a non-sensing axis stray magnetic field 40 of a certain field strength is applied. Thus, the distortion represented by the characteristic curves 56 in the presence of non-sensing axis stray magnetic fields 40 can be readily characterized and visualized in comparison with the absence of a non-sensing axis stray magnetic field 40.

Magnetoresistive sensor technologies may achieve better jitter accuracy than, for example, Hall sensors. However, magnetoresistive sensor technologies are typically sensitive in two spatial axes and are thus more prone to magnetic interference (i.e., stray) field influences, especially in combination with a gradiometer approach (discussed below). In accordance with embodiments described below, knowledge of the non-sensing axis stray magnetic fields 40 and knowledge of the dependency of the voltage response variations of external magnetic field 26 in the presence of non-sensing axis stray magnetic field 40 (e.g., due to characterization as indicated in FIG. 4) enables correction or cancellation of the effect of non-sensing axis stray magnetic fields 40 on external magnetic field 26. In addition, a gradient unit approach (discussed below) can additionally enable correction or cancellation of the effect of sensing axis stray magnetic fields 42 on external magnetic field 26. Thus, a system that includes magnetoresistive sense elements gains the benefit of improved jitter accuracy over Hall sensors, while the stray magnetic field cancellation techniques described herein enables the reduction of distortion effects typically observed in magnetoresistive sensor technologies.

Referring now to FIGS. 5 and 6, FIG. 5 shows a top view of a magnetic sense element 60 that includes a magnetic field source 62 in accordance with an embodiment and FIG. 6 shows a side sectional view of magnetic sense element 60 and magnetic field source 62 along section lines 6-6 of FIG. 5. Magnetic sense element 60 may be a magnetoresistive sense element such as an AMR, GMR, TMR sense element, and so forth capable of detecting a magnetic field. Further, magnetic sense element 60 may be a single stripe or dot, as well as include an array of the former. Only one magnetic sense element 60 is shown for simplicity. Other configurations may include multiple magnetic sense elements arranged in half-bridge or full bridge configurations. Magnetic sense element 60 is configured to sense external magnetic field 26 along the sensing axis, which is Y-axis 28 in this example. As discussed in detail above, magnetoresistive sense elements, such as magnetic sense element 60, are sensitive to interfering magnetic fields (e.g., non-sensing axis stray magnetic field 40 and sensing axis stray magnetic field 42).

In accordance with an embodiment, magnetic field source 62 is located proximate magnetic sense element 60. In this example, magnetic field source 62 includes an electrically conductive coil structure for providing an auxiliary magnetic field, represented by an arrow 64 and labeled $H_{Y(COIL)}$. Thus, magnetic field source 62 may alternatively be referred to herein as a coil structure 62. Auxiliary magnetic field 64 is generally oriented in the same direction as external magnetic field 26 and is thus aligned with the sensing axis, e.g., Y-axis 28. Coil structure 62 may include conductive, (for example, metallic) traces proximate magnetic sense element 62. In the illustrated example, coil structure 62 may include a first set of traces 66 that are located directly below magnetic sense element 60 and a second set of traces 68 that are located above magnetic sense element 60. First and second sets of traces 66, 68 are connected with vias 70 at their end points to form coil structure 62. First set of traces 66 are not visible in the top view shown in FIG. 5 and are thus represented by dashed lines in FIG. 5.

As will be discussed in greater detail below, coil structure 62 may be arranged such that a coil current, represented by incoming and outgoing arrows 72 in FIG. 5, flows through coil structure 62. When coil structure 62 is energized, coil current 72 flows through coil structure 62 and generates auxiliary magnetic field 64. This auxiliary magnetic field 64 is detectable by magnetic sense element 62. As will be discussed in significantly greater detail below, this auxiliary magnetic field 62 will be superimposed on external magnetic field 26 and the sensor response, also referred to herein as a voltage response, will be modified or changed by non-sensing axis stray magnetic field 40.

In the configuration shown in FIGS. 5-6, coil current 72 flows through a total of three traces of first set of traces 66 and four traces of second set of traces 68 to form three and a half coil turns. Alternative embodiments may include more than or less than the quantity of coil turns shown to obtain the required magnetic field strength of auxiliary magnetic field 64. Still other embodiments may include a first set of traces disposed above or below magnetic sense element 60 and a second set of traces disposed approximately co-planar with magnetic sense element 60. Further, coil structure 62 need not be three-dimensional, but may instead be generally planar and positioned directly above or directly below magnetic sense element 60. Additionally, a single magnetic field source (coil structure) 62 may be located proximate two or more magnetic sense elements 60 for concurrently providing auxiliary magnetic field 64 to the multiple magnetic sense elements 60 or two or more magnetic field sources may be implemented in which each magnetic field source provides auxiliary magnetic field 64 to different magnetic sense elements 60.

Magnetic sense element 60 and coil structure 62 may be fabricated on, or otherwise integrated with, an application specific integrated circuit (ASIC) 74 using, for example, top metal layers of ASIC 74. ASIC 74 may implement, among other features, a current generator 76 for providing coil current 72 to coil structure 62 and/or a processing circuit 78 that is customized to function with magnetic sense element 60 and coil structure 62. Current generator 76 and processing circuit 78 are represented by simple blocks within ASIC 74. However, those skilled in the art will recognize that current generator 76 and processing circuit 78 can encompass a wide variety of processing, control, or other structures. Therefore, in the interest of brevity and minimization of any risk of obscuring the principles and concepts of the various embodiments, further discussion of such structures, if any, will be limited to the essentials with respect to the principles and concepts of the various embodiments.

Figure 7:
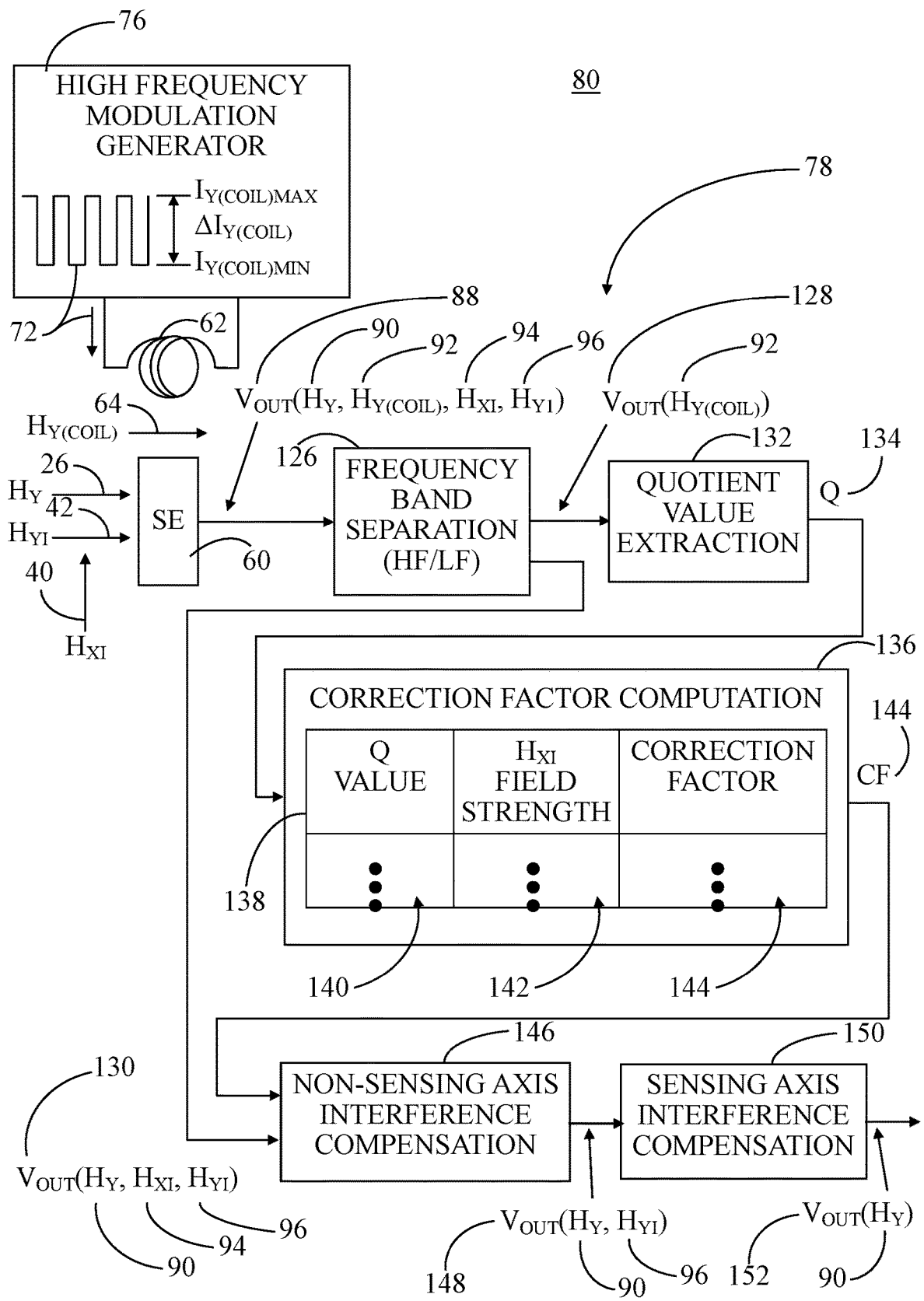
FIG. 7 shows a simplified block diagram system incorporating the magnetic sense element and magnetic field source of FIGS. 5-6.

FIG. 7 shows a simplified block diagram of a system 80 incorporating magnetic sense element 60 and coil structure 62. The block diagram of FIG. 7 is provided to demonstrate the cancellation of the adverse signal contributions of non-sensing and sensing axis stray magnetic fields 40, 42 to an output signal representing the external magnetic field. Additional processing operations will not be described herein for brevity.

System 80 includes current generator 76 and processing circuit 78 of ASIC 74 (FIG. 7). Current generator 76 may be referred to herein as a high frequency (HF) modulation generator. Current generator 76 is configured to output coil current 72 as a periodically varying current to coil structure 62. In an embodiment, coil current 72 has a higher frequency than the expected frequency of external magnetic field 26 (e.g., from an encoder wheel), hence the term "high frequency" or "HF." The periodically varying coil current 72 through coil structure 62 generates a corresponding periodically varying auxiliary magnetic field 64. In the illustrated example, periodically varying coil current 72 may be a square wave having a maximum value, $I_{Y(COIL)MAX}$, which generates auxiliary magnetic field 64 having a maximum field strength 82, $H_{Y(COIL)MAX}$ (shown in FIG. 9), and having a minimum value, $T_{Y(COIL)MIN}$, which generates auxiliary magnetic field 64 having a minimum field strength 84, $H_{Y(COIL)MIN}$ (shown in FIG. 9), generated by coil structure 62. The step height response to the square wave auxiliary magnetic field 64 with step height 86, $\Delta H_{Y(COIL)}$ also shown in FIG. 9 (i.e., the difference between maximum field strength 82 and minimum field strength 84) varies, or changes, from a baseline or expected value, in response to non-sensing axis magnetic field 40. Although a square wave is shown herein, alternative embodiments may implement another periodically varying waveform.

Coil structure 62 is energized with coil current 72 continuously during normal use. A first output signal 88, $V_{OUT}$ ($H_Y$, $H_{Y(COIL)}$, $H_{XT}$, $H_{YT}$) of magnetic sense element 60 reflects all magnetic field sources (i.e., external magnetic field 26, auxiliary magnetic field 64, non-sensing axis stray magnetic field 40, and sensing axis stray magnetic field 42). Since coil structure 62 is energized with coil current 72 continuously, auxiliary magnetic field 64 will be superimposed on, or modulate (change) the sensed external magnetic field 26, hence the term "MODULATION" in the term high frequency modulation generator. Accordingly, magnetic sense element 60 produces first output signal 88 (a voltage output in this instance) having a magnetic field signal component 90 responsive to external magnetic field 26 and an auxiliary magnetic field component 92 responsive to auxiliary magnetic field 64. In the presence of stray magnetic fields, first output signal 88 will additionally have a non-sensing axis stray field signal component 94 and a sensing axis stray field signal component 96. Thus, the term "component" utilized herein refers to the parts or constituents (i.e., external magnetic field 26, auxiliary magnetic field 64, non-sensing axis stray magnetic field 40, and sensing axis stray magnetic field 42) that make up first output signal 88.

In the interest of clarity, external magnetic field 26 and magnetic field signal component 90 share the same label, $H_Y$, in the illustrations. Likewise, auxiliary magnetic field 64 and auxiliary magnetic field component 92 share the same label, $H_{Y(COIL)}$. Non-sensing axis stray magnetic field 40 and non-sensing axis stray field signal component 94 share the same label, $H_{XT}$. And, sensing axis stray magnetic field 42 and sensing axis stray field signal component 96 share the same label, $H_{YT}$. In accordance with an embodiment, non-sensing axis stray field signal component 94 will largely be canceled utilizing auxiliary magnetic field component 92.

Figure 8:
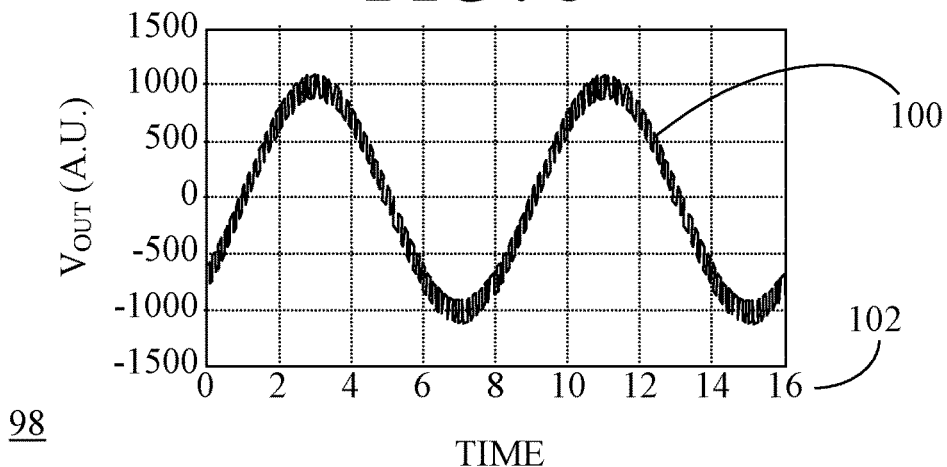
FIG. 8 shows a graph of a voltage output signal over time that includes a magnetic field signal component modulated by an auxiliary magnetic field signal component along the sensing axis provided by a magnetic field source.

Prior to a continued description of FIG. 7, FIGS. 8-10 will be discussed. Referring now to FIG. 8, FIG. 8 shows a graph 98 of a voltage output signal 100 over time 102 that includes magnetic field signal component 90 (FIG. 7) modulated by auxiliary magnetic field component 92 resulting from auxiliary magnetic field 64 (FIG. 5) along the sensing axis, e.g., Y-axis 28 (FIG. 5). In continuation of the example presented in FIG. 3, FIG. 8 depicts external magnetic field signal 49 (FIG. 3) modulated by auxiliary magnetic field 64 (FIG. 5) to yield voltage output signal 100. The time varying, higher frequency auxiliary magnetic field signal component 92 (corresponding to auxiliary magnetic field 64) is superimposed on magnetic field signal 49 (i.e., the measurement signal). However, voltage output signal 100 is not further modified by non-sensing axis stray magnetic field 40 (FIG. 5) in graph 98.

Figure 9:
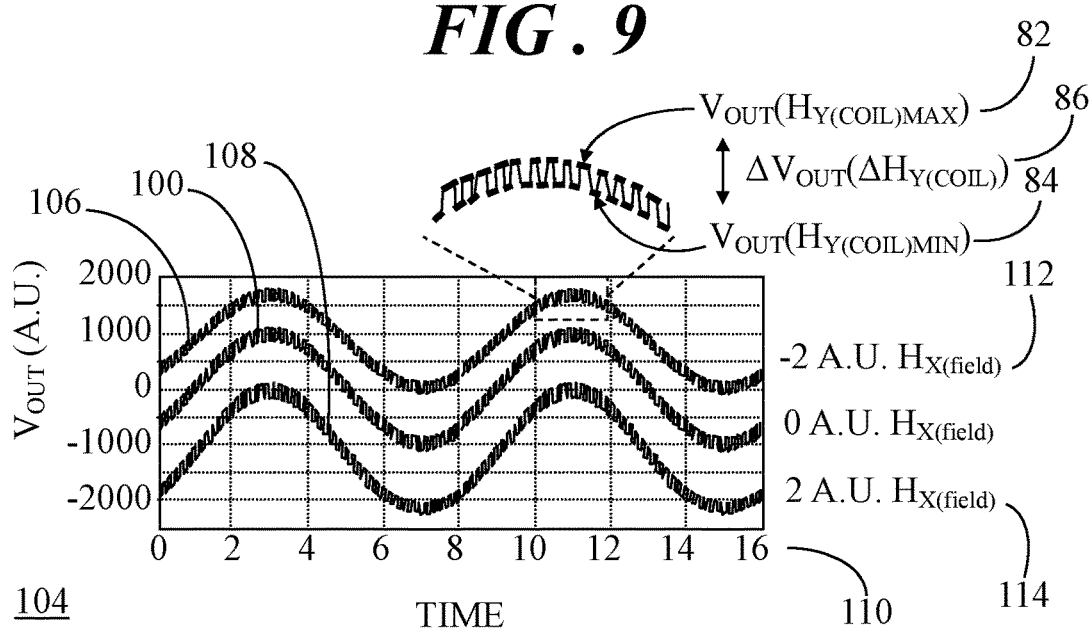
FIG. 9 shows a graph of a voltage output signals over time in which the voltage output signal of FIG. 8 is modulated by interference magnetic fields directed along the non-sensing axis.

FIG. 9 shows a graph 104 of voltage output signals 106, 108 over time 110 in which voltage output signal 100 of FIG. 8 is modified by an interference magnetic field (e.g., non-sensing axis stray magnetic field 40 (FIG. 5) directed along the non-sensing axis (e.g., X-axis 30, FIG. 5). Voltage output signal 100 is replicated in graph 104 to show the baseline output signal in the absence non-sensing axis stray magnetic field and to highlight an influence that non-sensing axis stray magnetic field 40 (FIG. 5) has on voltage output signals 106, 108 at two example field strengths 112, 114. In this example, voltage output signal 106 is influenced by non-sensing axis stray magnetic field 40 having field strength 112 of −2 A.U. and voltage output signal 108 is influenced by non-sensing axis stray magnetic field 40 having field strength 114 of 2 A.U. Of particular relevance, step height response 86 (which is the difference between maximum field strength 82 and minimum field strength 84) to the periodically varying square wave auxiliary magnetic field 64 (FIG. 7) changes depending upon the field strength of non-sensing axis stray magnetic field 40. As a side effect, an offset shift depending upon the field strength of non-sensing magnetic field 40 may be observed in FIG. 9.

Figure 10:
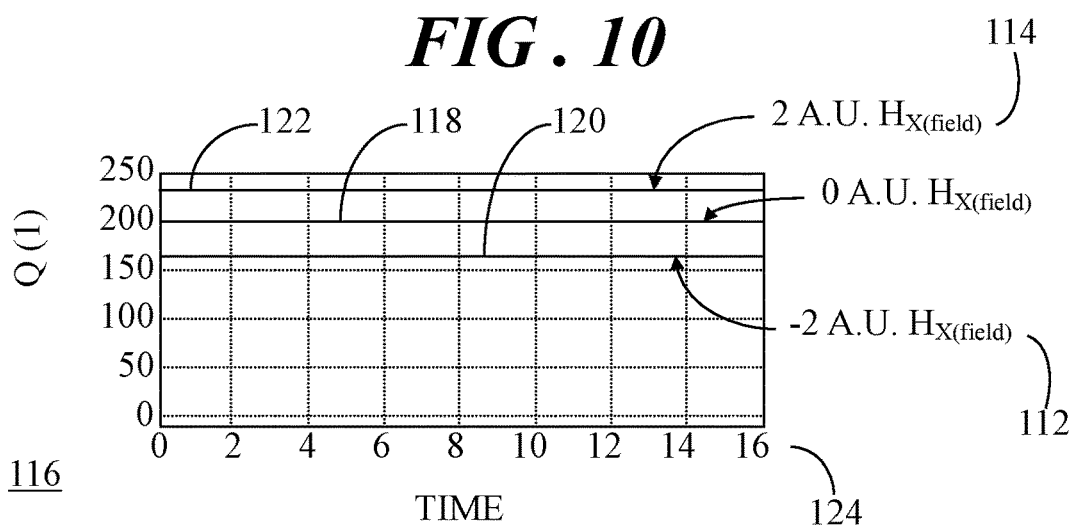
FIG. 10 shows graph of quotient values over time computed in response to the voltage output signals shown in FIG. 9.

FIG. 10 shows graph 116 of quotient values 118, 120, 122 (Q) over time 124 computed in response to the voltage output signals 100, 106, 108 and step height response 86 shown in FIG. 9. Quotient value, Q, can be determined as follows:

$$Q = \frac{V_{OUT}(H_{Y(COIL)MAX}) - V_{OUT}(H_{Y(COIL)MIN})}{V_{OUT,NORM}} \quad (1)$$

In equation (1), the term "$V_{OUT}$" refers to the voltage response of magnetic field sensor 60 (FIG. 5), "$H_{Y(COIL)MAX}$" refers to maximum field strength 82 generated by coil structure 62, "$H_{Y(COIL)MIN}$" refers to the minimum field strength 84 generated by coil structure 62, and $V_{OUT,NORM}$ is the voltage response which is expected in the absence of non-sensing axis stray magnetic field 40 (FIG. 5). The sensor voltage response, "$V_{OUT}$" changes in the presence of stray magnetic field 40 which, in turn, changes a step height response 86 (i.e., the voltage difference between maximum field strength 82 and minimum field strength 84 and labeled $\Delta V_{OUT}(\Delta H_{Y(COIL)})$ in FIG. 5) relative to a baseline difference in the absence of non-sensing axis stray magnetic fields 40. It can be observed from equation (1) that the ratio is constant over time 124 and that a clear influence from the field strength of non-sensing axis stray magnetic field 40 can be determined. That is, a certain field strength of non-sensing axis stray magnetic field 40 results in a distinct, or unique, quotient value 118, 120, 122. Thus, field strength of non-sensing axis stray magnetic field 40 is determinable from quotient value 118, 120, 122. By using the knowledge of the characteristic curve dependency from non-sensing axis stray magnetic fields 40, a correction of the characteristic curve is possible and the error due to non-sensing axis stray magnetic fields 40 can be eliminated.

With reference back to FIG. 7 and in light of the information presented in FIGS. 8-10, quotient values in the presence of non-sensing axis stray magnetic fields 40 can be characterized and saved in memory of ASIC 74 during a calibration process. During normal use, coil structure 62 may be energized continuously to produce auxiliary magnetic field 64. In order to identify non-sensing axis stray magnetic field 40, the sensor output component caused by auxiliary magnetic field 64 (i.e., auxiliary magnetic field signal component 92) can be compared with the expected data from calibration. Based upon the comparison, an identification of the field strength of non-sensing axis stray magnetic field 40 can be determined based on the quotient value, and a correction factor associated with the quotient value can be applied to largely cancel non-sensing stray field signal component 94 from first output signal 88.

Now with continued reference to the block diagram of FIG. 7, first output signal 88 is provided to frequency band separation circuitry 126 of processing circuit 78. As discussed above, coil current 72 and hence auxiliary magnetic field 64, may have a higher frequency than the expected external excitation (e.g., external magnetic field 26). Thus, frequency band separation circuitry 126 separates the higher frequency auxiliary magnetic field signal component 92 from first output signal 88. Frequency band separation circuitry 126 may include a high pass filter to extract a high frequency output signal 128 from first output signal 88 that includes auxiliary magnetic field signal component 92. Frequency band separation circuitry 126 may additionally include a low pass filter to extract a low frequency output signal 130 from first output signal 88 that includes magnetic field signal component 90. Low frequency output signal 130 may additionally include non-sensing axis stray field signal component 94 and sensing axis stray field signal component 96.

Frequency band separation circuitry 126 is represented as a general filter block. Those skilled in the art will recognize that a wide variety of filter circuits and/or down-mixing configurations may be implemented to extract or otherwise separate auxiliary magnetic field signal component 92 from first output signal 88. Further, first output signal 88 may be an analog signal. Further processing may be performed in the digital domain. Hence, frequency band separation circuitry 126 may additionally entail analog-to-digital conversion of first output signal 88 with a predefined low pass characteristic and additional filters to achieve the high frequency/low frequency separation.

Upon extraction of the higher frequency auxiliary magnetic field signal component 92, high frequency output signal 128 may be provided to quotient value extraction circuitry 132. The expected value (i.e., absent non-sensing axis stray magnetic field 40) for the signal amplitude is known as generated at high frequency modulation generator 76. Thus, quotient value extraction circuitry 132 extracts a quotient value 134, labeled Q, as a ratio of the measured output signal 128 relative to the expected output signal (i.e., absent non-sensing axis stray magnetic field 40) as demonstrated in equation (1). Upon extraction of quotient value 134 at quotient value extraction circuitry 132, quotient value 134 is provided to correction factor computation circuitry 136. Correction factor computation circuitry 136 may have a memory element 138 associated with it containing calibration data. This calibration data can include a database of quotient values 140, a unique magnetic field strength parameter 142 associated with each quotient value 140, and a unique correction factor (CF) 144 dependent upon each quotient value 140. Correction factor 144 represents the inverse behavior of non-sensing axis stray field signal component 94. As an example, if a transfer function for the magnetoresistive sense element is 1×, and the transfer function changes due to non-sensing axis stray field signal component 94 by 2×, than correction factor 144 would be (½)× in order to correct for non-sensing axis stray field signal component 94.

Correction factor 144 in turn is provided to non-sensing axis interference compensation circuitry 146. Additionally, low frequency output signal 130 containing magnetic field signal component 90, non-sensing axis stray field signal component 94, and sensing axis stray field signal component 96 is provided from frequency band separation circuitry 126 to non-sensing axis interference compensation circuitry 146. Non-sensing axis interference compensation circuitry 146 applies correction factor 144 to low frequency output signal 130 to produce a second output signal 148 in which non-sensing axis stray field signal component 94, $H_{XT}$, representing the influence of non-sensing axis stray magnetic field 40 is substantially removed. As shown, $H_{XT}$ compensation circuitry 146 provides second output signal 148 in which non-sensing axis stray field signal component 94 is canceled.

To summarize, methodology performed by system 80 entails energizing a magnetic field source (coil structure 62) located proximate the magnetic sense element 60 to generate auxiliary magnetic field 64 along the sensing axis (Y-axis 28) of magnetic sense element 60. Magnetic sense element 60 produces first output signal 88 having magnetic field signal component 90 responsive to external magnetic field 26, the magnetic field signal component 90 being modulated by auxiliary magnetic field signal component 92 responsive to auxiliary magnetic field 64. The methodology further comprises receiving, at a processing circuit 78, first output signal 88, identifying from first output signal 88 an influence 94 (HO of magnetic interference field 40 on auxiliary magnetic field signal component 92, the magnetic interference field 40 being directed along the non-sensing axis (X-axis 30) of magnetic sense element 60, and applying a correction factor 144 to low frequency output signal 130 of first output signal 88 to produce a second output signal 148 in which the influence of the magnetic interference field 40 is substantially removed.

In this example, second output signal 148 may thus include or is otherwise a function of magnetic field signal component 90, $H_Y$, and sensing axis stray field signal component 96, $H_{YT}$. In accordance with some embodiments, second output signal 148 may be provided to sensing axis interference compensation circuitry 150. Sensing axis interference compensation circuitry 150 compensates for or otherwise cancels sensing axis stray field signal component 96 from second output signal 148 to yield a third output signal 152. As shown, sensing axis interference compensation circuitry 150, provides third output signal 152 in which sensing axis stray field signal component 96 is canceled. The cancellation of sensing axis stray field signal component 96 may be performed in accordance with a gradient unit configuration approach described below in connection with FIGS. 11-17. In FIG. 7, sensing axis interference compensation circuitry 150 is shown as having a single input for simplicity of illustration. However, in a gradient unit configuration, system 80 would be configured to include at least one additional input to sensing axis interference compensation circuitry 150, as shown and discussed in connection with FIG. 16.

Third output signal 152 can thereafter undergo further processing operations, such as, offset correction, protocol generation, pulse-shaping, and so forth that are not described herein for brevity. Additionally, processing circuit 78 may include linearization circuitry along the signal processing chain in a configuration that includes non-linear magnetic sense elements. Further, even in a configuration that implements linear magnetic sense elements, it may be necessary to perform linearization (via trimming) to fulfill predetermined design requirements.

Thus, third output signal 152 largely includes magnetic field signal component 90 representing the measured external magnetic field 26 in which the influence of non-sensing axis stray magnetic field 40 and sensing axis stray magnetic field 42 is removed or cancelled. Further, since magnetoresistive sense elements are largely insensitive to stray magnetic fields along Z-axis 32, as discussed above, the resulting third output signal 152 is substantially free of influence from stray magnetic fields (interference magnetic fields) along all three axes.

Figure 11:
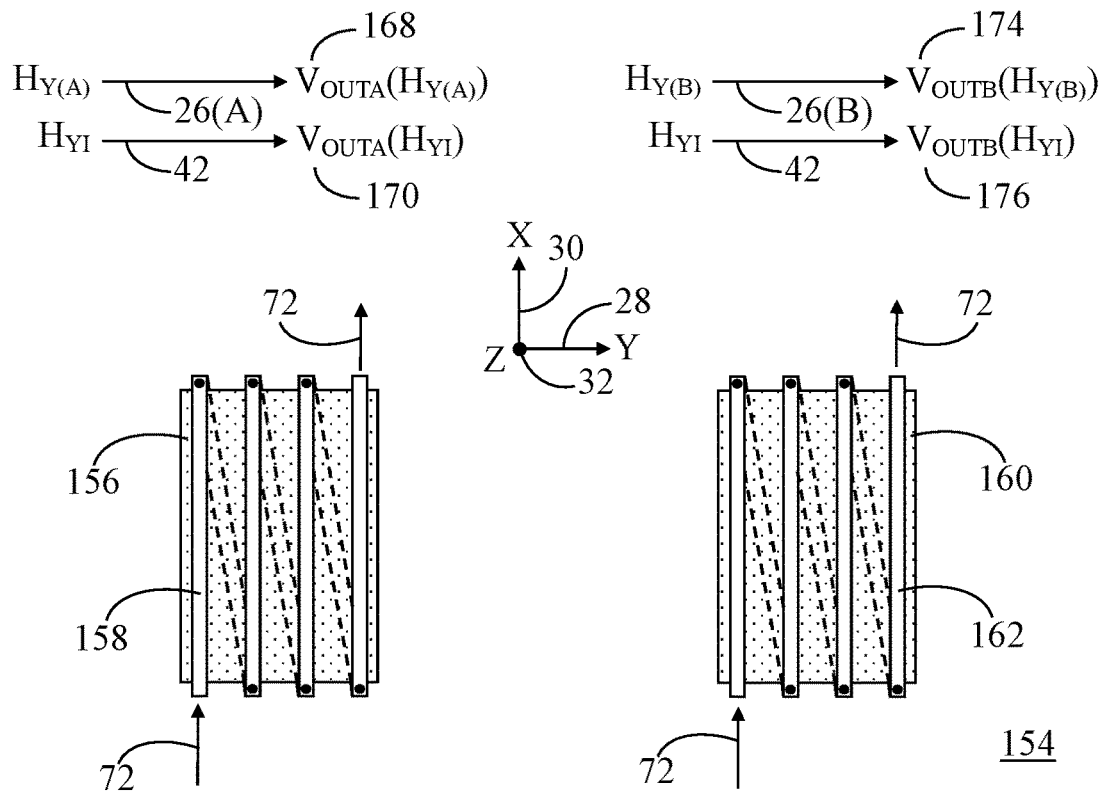
FIG. 11 shows a simplified top view of a pair of magnetic sense elements arranged as a gradient unit, each including a magnetic field source.
Figure 12:
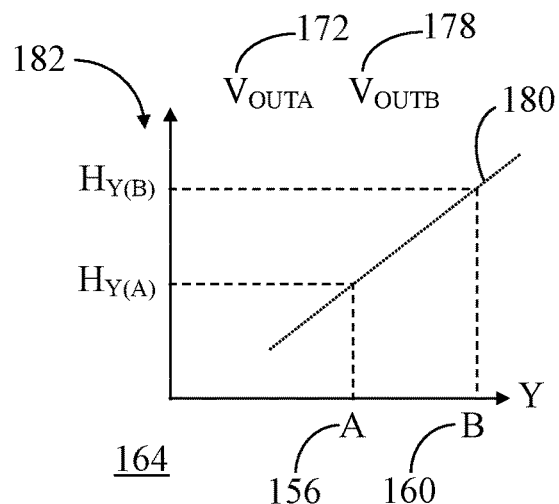
FIG. 12 shows a graph of an example of a magnetic gradient field distribution in a direction parallel to the sensing axis for the gradient unit of FIG. 11.
Figure 13:
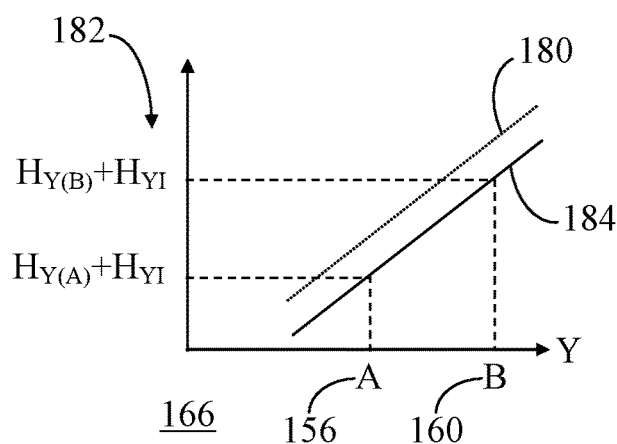
FIG. 13 shows a graph of the magnetic gradient field distribution along the direction of the sensing axis for the gradient unit modified in response to an interference magnetic field directed along the sensing axis.
Figure 18:
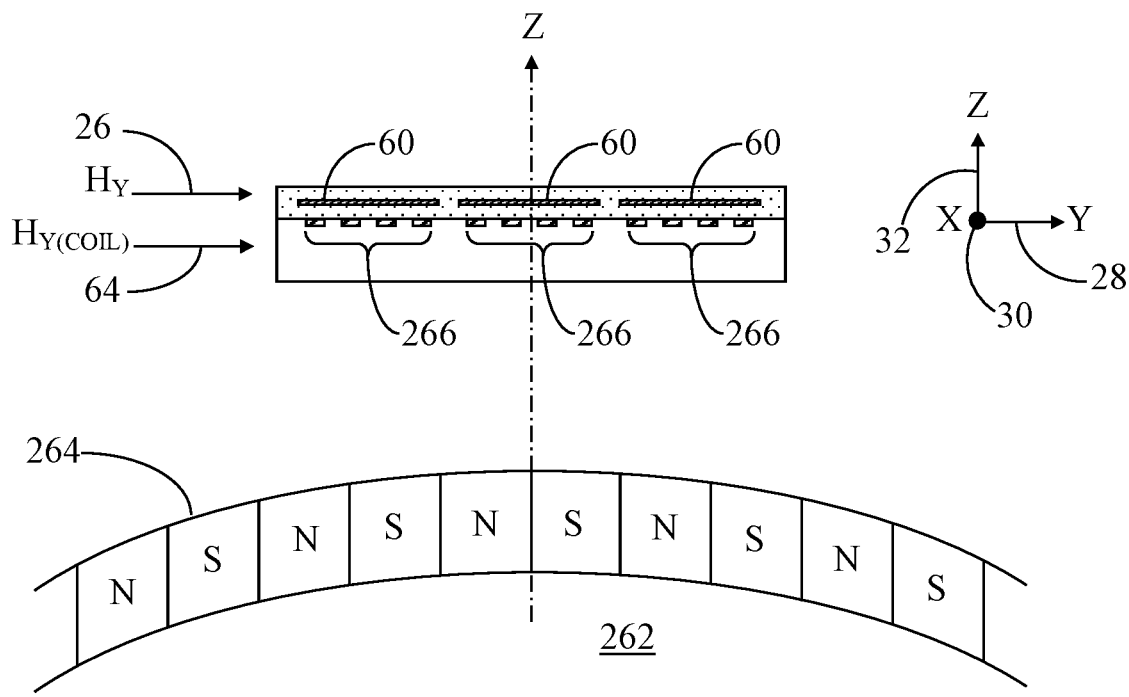
FIG. 18 shows a simplified partial side view of a system for rotational speed measurement.
Figure 19:
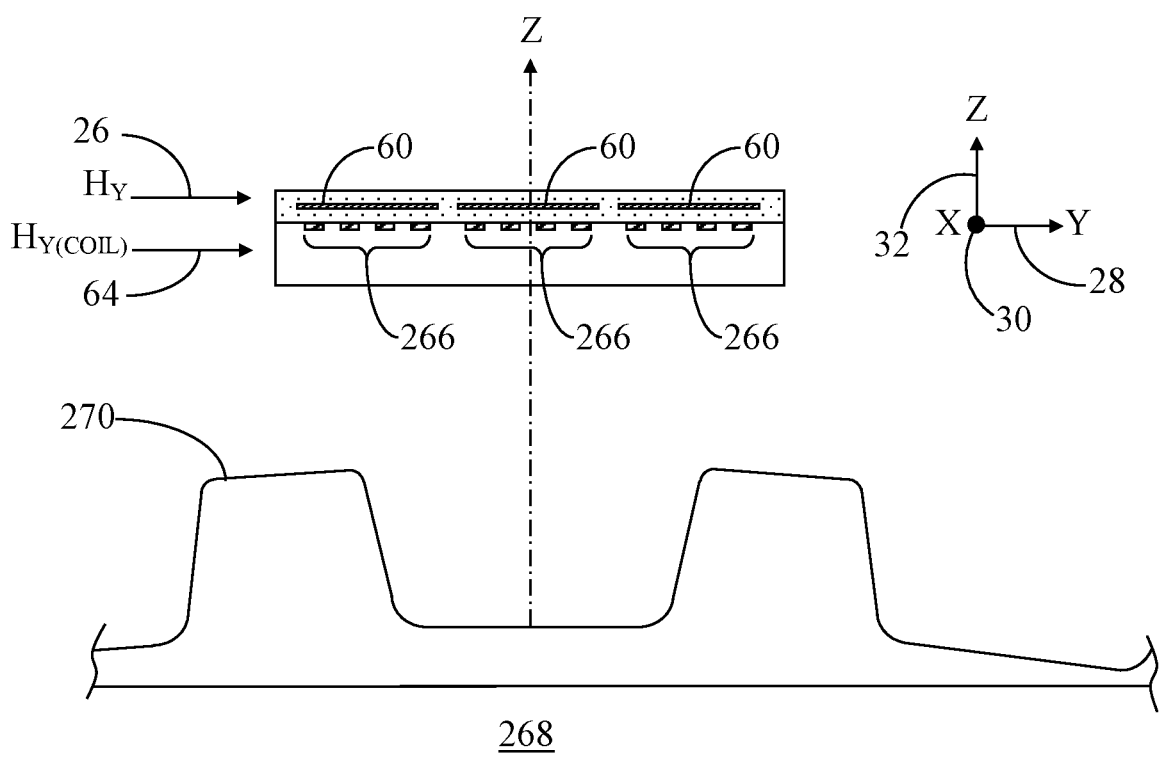
FIG. 19 shows a simplified partial side view of another system for rotational speed measurement.

Subsequent discussion in connection with FIGS. 11-17 applies to a gradient unit approach that may be employed to cancel or otherwise compensate for sensing axis stray magnetic field 42 at, for example, sensing axis interference compensation circuitry 150, within system 80 (FIG. 7). FIGS. 11-13 will first be discussed to provide a generalized approach for cancelling or otherwise compensating for sensing axis stray magnetic field 42. FIGS. 14-17 are subsequently provided to describe a configuration for determining an angle of rotation that additionally includes the structure discussed above for canceling non-sensing and sensing stray magnetic fields 40, 42. Additionally, FIGS. 18 and 19 are provided to describe a configuration for rotational speed measurement that additionally includes the structure discussed above for canceling at least non-sensing stray magnetic field 40.

With reference now to FIG. 11, FIG. 11 shows a simplified top view of a pair of magnetic sense elements arranged as a gradient unit 154. Gradient unit 154 includes a first magnetic sense element 156, encompassed by a first coil structure 158 (i.e., a first magnetic field source), and a second magnetic sense element 160 encompassed by a second coil structure 162 (i.e., a second magnetic field source). First and second magnetic sense elements 156, 160 are laterally spaced apart along the sensing axis direction (i.e., Y-axis 28). First and second magnetic sense elements 156, 160 are configured to sense external magnetic field 26 along the sensing axis, which is Y-axis 28 herein. Thus, for purposes of clarity, first magnetic sense element 156 senses external magnetic field 26(A), labeled $H_{Y(A)}$, and second magnetic sense element 160 senses external magnetic field 26(B), labeled $H_{Y(B)}$. Any difference in the magnetic field strength measured by each of first and second magnetic sense elements 156, 160 can be used to determine the magnetic field gradient in a direction parallel to Y-axis 28.

Like the description provided in connection with FIGS. 5-7, first and second coil structures 158, 162 are arranged such that coil current 72 flows through each of first and second coil structures 158, 162 and generates magnetic auxiliary magnetic field 64 (FIG. 5). Again, this auxiliary magnetic field 64 can be used to identify and cancel non-sensing axis stray magnet field 40 (FIG. 5) as discussed in detail above. The gradient unit configuration of first and second magnetic sense elements 156, 160 can be implemented to additionally cancel homogeneous sensing axis stray magnetic field 42 along the sensing axis, i.e., Y-axis 28.

Referring to FIGS. 12 and 13 in connection with FIG. 11, FIG. 12 shows a graph 164 of an example of a magnetic gradient field distribution in a direction parallel to the sensing axis (i.e., Y-axis 28) and FIG. 13 shows a graph 166 of the magnetic gradient field distribution along the direction of the sensing axis (i.e., Y-axis 28) gradient unit 154 modified in response to sensing axis stray magnetic field 42, $H_{YT}$, directed along Y-axis 28. As such, graph 164 shows the magnetic gradient field distribution without the presence of a magnetic interference field and graph 166 shows the magnetic gradient field distribution with the presence of a magnetic interference field sensing axis stray magnetic field 42.

In general, multiplication of external magnetic field 26(A) with the sensor sensitivity, S (discussed below), results in a first output signal component 168, labeled $V_{OUTA}(H_{Y(A)})$, represented in FIG. 11. Further, multiplication of sensing axis stray magnetic field 42 with sensor sensitivity, S, results in a first stray field signal component 170, labeled $V_{OUTA}(H_{YT})$, represented in FIG. 11. Therefore, a voltage output signal 172 (generally represented by the term $V_{OUTA}$ in FIG. 12) from first magnetic sense element 156 can be characterized as $V_{OUTA}(H_{Y(A)}+H_{YT})$. Similarly, multiplication of external magnetic field 26(B) with the sensor sensitivity, S (discussed below), results in a second output signal component 174, labeled $V_{OUTB}(H_{Y(B)})$. Again, multiplication of sensing axis stray magnetic field 42 with sensor sensitivity, S, results in a second stray field signal component 176, labeled $V_{OUTB}(H_{YT})$. Therefore, a voltage output signal 178 (generally represented by the term $V_{OUTB}$ in FIG. 12) from second magnetic sense element 160 can be characterized as $V_{OUTB}(H_{Y(B)}+H_{YT})$.

In FIG. 12, a dotted line 180 represents a linear gradient range and related magnetic field 182 that results in first and second voltage output voltage signals 172, 178 at the relative positions of first and second magnetic sense elements 156, 160. In FIG. 13, dotted line 180 is again shown. Additionally, a solid line 184 represents a linear gradient range and related magnetic field 182 that results in first and second output voltage signals 172, 178 at the relative positions of first and second magnetic sense elements 156, 160 with an additional spatial homogenous interference magnetic field component, e.g., sensing axis stray magnetic field 42, $H_{YT}$.

In general, output voltages VA and VB (i.e., voltage output signals 172, 178) of first and second magnetic sense elements 156, 160 of gradient unit 154 can be described as follows:

$$V_{OUTA}=S \times H_{Y(A)} \qquad (2)$$

$$V_{OUTB}=S \times H_{Y(B)} \qquad (3)$$

S is the sensitivity of the magnetic sense elements and is assumed to be equal for both of first and second magnetic sense elements 156, 160 (e.g., achieved by fabrication accuracy or trimming). Thus, sensing axis stray magnetic field 42, $H_{YT}$, leads to the same voltage shift in both of first and second magnetic sense elements 156, 160 as follows:

$$V_{OUTA}=S \times (H_{Y(A)}+H_{YT})=S \times H_{Y(A)}+S \times H_{YT} \qquad (4)$$

$$V_{OUTB}=S \times (H_{Y(B)}+H_{YT})=S \times H_{Y(B)}+S \times H_{YT} \qquad (5)$$

Equations (4) and (5) are valid only if magnetic sense elements 156, 160 are linear (i.e., have a linear response curve, for example, by trimming, and are in non-saturation). Therefore, the sensitivity (S) does not depend upon the magnetic field amplitude for the sensing axis magnetic fields. Calculation of a differential output signal for gradient unit 154 entails taking the difference of the two voltage signals and thereby cancelling sensing axis stray field signal components 170, 176, as shown in the following equation (6):

$$D_{A,B} = V_{OUTB} - V_{OUTA} = \qquad (6)$$
$$(S \times H_{Y(B)} + S \times H_{YI}) - (S \times H_{Y(A)} + S \times H_{YI}) = S \times (H_{Y(B)} - H_{Y(A)})$$

As demonstrated above, the implementation of coil structures as discussed in connection with FIGS. 5-10 along with the implementation of the gradient unit configuration discussed in connection with FIGS. 11-13 can counteract, or otherwise cancel, the effects of non-sensing and sensing axis stray magnetic fields 40, 42 in magnetoresistive sense elements to yield magnetoresistive sense elements that are robust against generally homogeneous stray magnetic fields from every direction.

Figure 14:
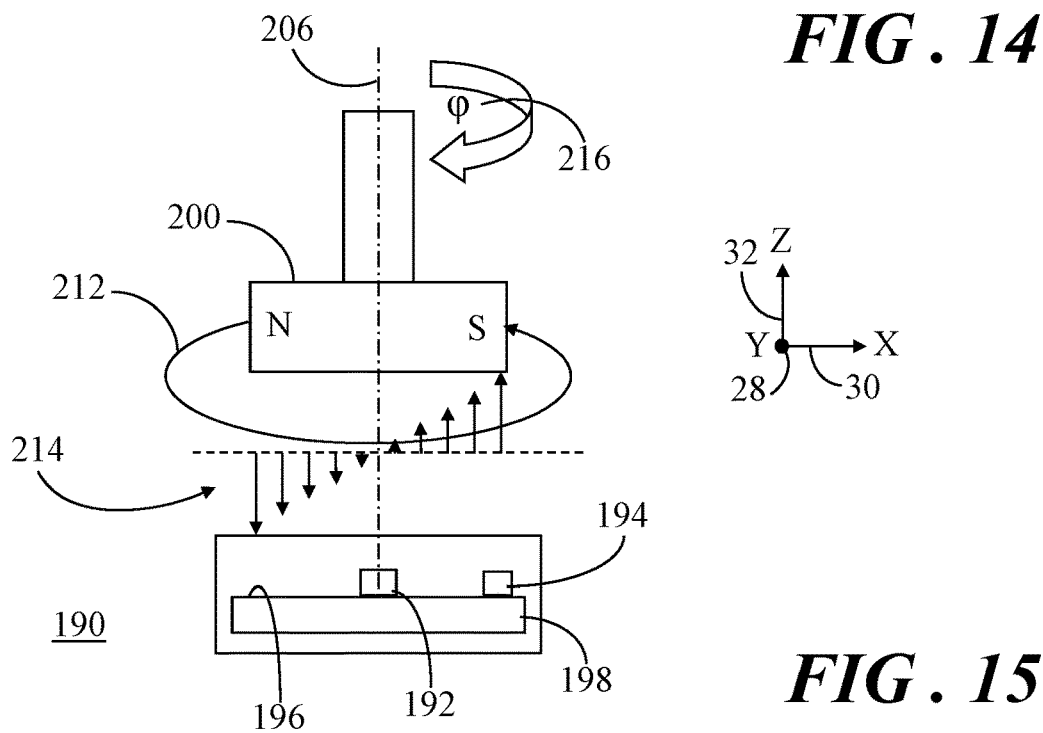
FIG. 14 shows a simplified partial side view of a system for rotation angle sensing.
Figure 15:
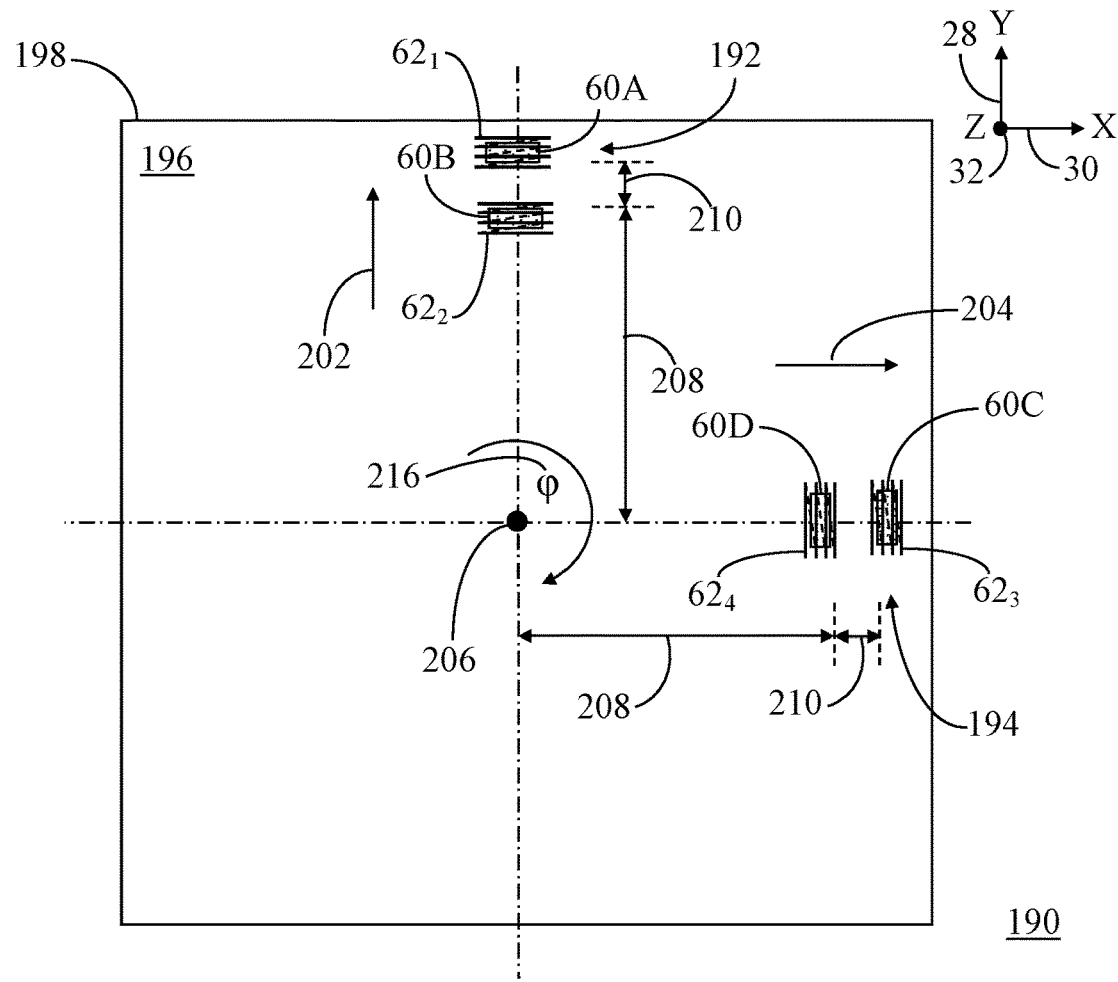
FIG. 15 shows a simplified partial top view of the system of FIG. 14.

Referring now to FIGS. 14-15, FIG. 14 shows a simplified partial side view of a system 190 for rotation angle sensing and FIG. 15 shows a simplified partial top view of system 190. In the embodiment of FIGS. 14-15, magnetic sense elements 60 with coil structures 62 may be suitably configured to sense angular position of an object in a gradiometer configuration.

System 190 generally includes first and second gradient units 192, 194 formed on a surface 196 of a substrate 198 and a magnet 200 vertically displaced away from first and second gradient units 192, 194 along Z-axis 32. Magnet 200 is not shown in the top view illustrated in FIG. 15 in order to better visualize the features formed on surface 196 of substrate 198. First gradient unit 192 includes a first magnetic sense element (labeled 60A) and one of coil structures (labeled $62_1$) and a second magnetic sense element (labeled 60B) and one of coil structures (labeled $62_2$). Likewise, second gradient unit 194 includes a third magnetic sense element (labeled 60C) and one of coil structures (labeled $62_3$) and a fourth magnetic sense element (labeled 60D) and one of coil structures (labeled $62_4$).

In accordance with an embodiment, second gradient unit 194 is rotated ninety degrees relative to first gradient unit 192. That is, a longitudinal dimension of first and second magnetic sense elements, 60A, 60B is aligned with X-axis 30. Additionally, a longitudinal dimension of third and fourth magnetic sense elements, 60C, 60D is aligned with Y-axis 28. Thus, magnetic sense elements 60A, 60B are configured to sense an in-plane external magnetic field 202 along a first sense axis, i.e., Y-axis 28, oriented approximately parallel to surface 196 of substrate 198. Any difference in the magnetic field strength measured by each of magnetic sense elements, 60A, 60B can be used to determine the magnetic field gradient in a direction parallel to Y-axis 28. Magnetic sense elements 60C, 60D are configured to sense an in-plane measurement magnetic field 204 along a second sense axis, i.e., X-axis 30, oriented approximately parallel to surface 196 of substrate 198. Any difference in the magnetic field strength measured by each of magnetic sense elements, 60C, 60D can be used to determine the magnetic field gradient in a direction parallel to X-axis 30.

Second gradient unit 194 is spaced apart from first gradient unit 192 by ninety degrees relative to an axis of rotation 206 perpendicular surface 196 of substrate 198. Additionally, first and second gradient units 192, 194 may be located the same radial distance 208 away from axis of rotation 206. Further, first magnetic sense element 60A may be laterally spaced apart from second magnetic sense element 60B by a distance 210 and third magnetic sense element 60C may be laterally spaced apart from fourth magnetic sense element 60D by the same distance 210. In other embodiments, the distance between magnetic sense elements 60A, 60B, 60C, 60D may differ.

Magnet 200 may be a permanent magnet in the form of, for example, a disc, ring, rectangle, or bar shape. Magnet 200 is configured to rotate about axis of rotation 206 relative to first and second gradient units 192, 194. Magnet 200 produces a magnetic field 212 that rotates along with magnet 200 relative to first and second gradient units 192, 194. Magnetic field 212 has in-plane external magnetic field components 202, 204 and an out-of-plane magnetic field component 214 with gradient properties. Out-of-plane magnetic field component 214 has a magnetic field strength that changes as a function of the distance from axis of rotation 206, as represented by varying length arrows. By way of example, the magnetic field strength may be lowest at locations nearest to axis of rotation 206 and greatest at locations farthest from axis of rotation 206, but inside the magnet dimension.

In an embodiment, out-of-plane magnetic field component 214 is detectable by first and second gradient units 192, 194, and thus may be referred to herein as a magnetic gradient field 214. For example, system 190 may include magnetic field deflection elements, sometimes referred to as flux guides (not shown), that are configured to suitably redirect the out-of-plane magnetic field component 214 into the X-Y plane defined by X-axis 30 and Y-axis 28 for detection by magnetic sense elements 60A, 60B, 60C, 60D.

Out-of-plane magnetic field component 214 detected by first and second gradient units 192, 194, may be suitably processed to identify a rotation angle, 216, labeled cp, of magnet 200 relative to first and second gradient units 192, 194. Although only two gradient units (e.g., first and second gradient units 192, 194) are shown, alternative embodiments may include a multitude of gradient units. In such a configuration, the signals of the opposing gradient unit may be averaged or the like. Thus, possible errors from eccentricity and so forth may be mitigated. The provided example is for a configuration having out-of-plane gradient fields in a non-limiting manner. Alternative embodiments may be implemented with in-plane gradient field components.

Figure 16:
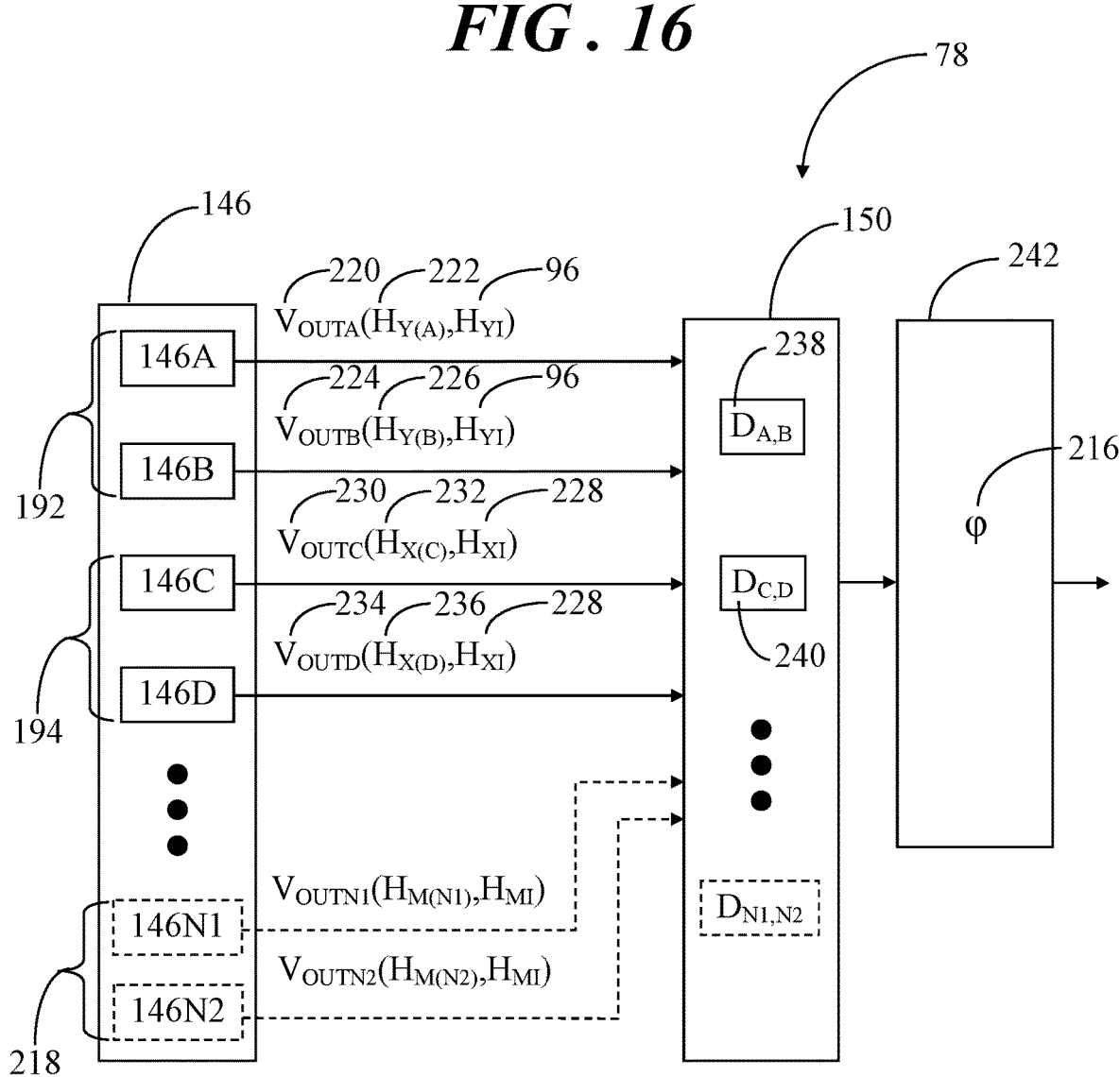
FIG. 16 shows a simplified partial block diagram of the system of FIG. 7 incorporating a gradient unit configuration for canceling stray magnetic fields along the sensing axis.

Referring to FIG. 16 in connection with FIGS. 14 and 15, FIG. 16 shows a simplified partial block diagram of system 80 (FIG. 7) incorporating a gradient unit configuration for canceling sensing axis stray magnetic field component 96 from the voltage output signal. The features of FIG. 16 will be described in connection with first and second gradient units 192, 194 of system 190. However, ellipses between second gradient unit and an "Nth" gradient unit 218 indicate that a system may include any predetermined quantity of gradient units in accordance with a particular design configuration. Further, the term letter "M" in association with the voltage outputs, $V_{OUTN1}$ and $V_{OUTN2}$, indicates an arbitrary axis. Still further, although two or more gradient units are specifically shown in FIG. 16, another embodiment may only implement a single gradient unit as represented by FIG. 11.

FIG. 16 is provided to emphasize that system 80 may be adapted to process multiple voltage output signals from multiple magnetic sense elements. In this example, the multiple voltage output signals have been processed through non-sensing axis interference compensation circuitry 146 to thereby largely cancel non-sensing axis stray field signal components resulting from non-sensing axis stray magnetic fields. Accordingly, sensing axis stray magnetic field compensation circuitry 150 may have multiple inputs. For illustrative purposes, a first compensation circuitry section 146A of non-sensing axis interference compensation circuitry 146 is electrically connected to first magnetic sense element 60A of first gradient unit 192 to provide a first voltage output signal 220, $V_{OUTA}$, having an external magnetic field component 222, $H_{Y(a)}$, as a function of in-plane external magnetic field 202 and having sensing axis stray magnetic field component 96. Similarly, a second compensation circuitry section 146B of non-sensing axis interference compensation circuitry 146 is electrically connected to second magnetic sense element 60B of first gradient unit 192 to provide a second voltage output signal 224, $V_{OUTB}$, having an external magnetic field component 226, $H_{Y(B)}$, as a function of in-plane external magnetic field 202 and having sensing axis stray magnetic field component 96.

It should be recalled from FIG. 15 that third and fourth magnetic sense elements 60C and 60D are configured to sense in-plane external magnetic field 204 along a second sense axis, i.e., X-axis 30, oriented approximately parallel to surface 196 of substrate 198. Thus, voltage output signals from third and fourth magnetic sense elements 60C and 60D may include a sensing axis stray magnetic field component 228, labeled $H_{XI}$, aligned with X-axis 30. Again for illustrative purposes, a third compensation circuitry section 146C of non-sensing axis interference compensation circuitry 146 is electrically connected to third magnetic sense element 60C of second gradient unit 194 to provide a third voltage output signal 230, $V_{OUTC}$, having an external magnetic field component 232, $H_{X(C)}$, as a function of in-plane external magnetic field 204 and having sensing axis stray magnetic field component 228. Similarly, a fourth compensation circuitry section 146D of non-sensing axis interference compensation circuitry 146 is electrically connected to fourth magnetic sense element 60D of second gradient unit 194 to provide a fourth voltage output signal 234, $V_{OUTD}$, having an external magnetic field component 236, $H_{X(D)}$, as a function of in-plane external magnetic field 204 and having sensing axis stray magnetic field component 228.

Thus, each of the voltage output signals is a function of an external magnetic field signal component and a sensing axis stray magnetic field signal component. More particularly, each of the voltage output signals is a summation of the external magnetic field signal component and the sensing axis stray field signal component, as shown in equations (4) and (5). Still further, sensing axis stray magnetic field signal component 96 along the first sensing axis, e.g., Y-axis 28, may differ from sensing axis stray magnetic field signal component 228 along the second sensing axis, e.g., X-axis 30.

Sensing axis stray magnetic field compensation circuitry 150 is electrically coupled with first gradient unit 192 and is configured to produce a first differential output signal 238 ($D_{A,B}$) as a difference between first and second voltage output signals 220, 224 in accordance with equations (2) through (6) described above. Likewise, sensing axis stray magnetic field compensation circuitry 150 is electrically coupled with second gradient unit 194 and is configured to produce a second differential output signal 240 ($D_{C,D}$) as a difference between third and fourth voltage output signals 230, 234. Of course, depending upon the configuration of gradient units, a multiplicity of differential output signals may be computed, as represented by $D_{N1,N2}$. Second differential output signal 240 is computed as follows:

$$V_{OUTC} = S \times H_{X(C)} \quad (7)$$

$$V_{OUTD} = S \times H_{X(D)} \quad (8)$$

S is the sensitivity of the magnetic sense elements and is assumed to be equal for both of third and fourth magnetic sense elements 60C, 60D (e.g., achieved by fabrication accuracy or trimming). Thus, sensing axis stray magnetic field 228, $H_{XI}$, leads to the same voltage shift in both of third and fourth magnetic sense elements 60C, 60D as follows:

$$V_{OUTC} = S \times (H_{X(C)} + H_{XI}) = S \times H_{X(C)} + S \times H_{XI} \quad (9)$$

$$V_{OUTD} = S \times (H_{X(D)} + H_{XI}) = S \times H_{X(D)} + S \times H_{XI} \quad (10)$$

Accordingly, calculation of a differential output signal for second gradient unit 194 entails taking the difference of the two voltage signals and thereby cancelling sensing axis stray field signal component 228, as follows:

$$D_{C,D} = \quad (11)$$
$$V_{OUTD} - V_{OUTC} = (S \times H_{X(D)} + S \times H_{XI}) - (S \times H_{X(C)} + S \times H_{XI}) =$$
$$S \times (H_{X(D)} - H_{X(C)})$$

Referring to FIGS. 14-16, processing circuit 78 may include rotation angle determination circuitry 242. By way of example, rotation angle determination circuitry 242 includes a combination of structural and software configured components to determine rotation angle 216 in accordance with the configuration of system 190 shown in FIGS. 14-15. In general, the magnetic field gradient, e.g., for out-of-plane magnetic field components 214 (FIG. 14), at the position of first and second magnetic sense elements 60A, 60B of first gradient unit 192 can be described as:

$$H_{Y(A)} = H_{mA} \times \sin \varphi \quad (12)$$

$$H_{Y(B)} = H_{mB} \times \sin \varphi \quad (13)$$

In equations (12) and (13) and the subsequent equations (14) and (15), $H_m$ represents the amplitude of the redirected/deflected in-plane external magnetic field. Due to the ninety-degree rotated arrangement of first and second gradient units, the mathematical relationship of third and fourth magnetic sense elements 60C, 60D of second gradient unit 194 can be described as:

$$H_{X(C)} = H_{mA} \times \cos \varphi \quad (14)$$

$$H_{X(D)} = H_{mB} \times \cos \varphi \quad (15)$$

The magnetic field gradient for first gradient unit 192 can therefore be described as:

$$H_{X(D)} - H_{X(C)} = \quad (17)$$
$$H_{mB} \times \cos\varphi - H_{mA} \times \cos\varphi = (H_{mB} - H_{mA}) \times \cos\varphi = H_{mG1} \times \cos\varphi$$

The operator $H_{mG1}$ is equal to ($H_{mB} - H_{mA}$). Similarly, the magnetic field gradient for second gradient unit 194 can be described as:

$$H_{Y(B)} - H_{Y(A)} = \quad (16)$$
$$H_{mB} \times \sin\varphi - H_{mA} \times \sin\varphi = (H_{mB} - H_{mA}) \times \sin\varphi = H_{mG1} \times \sin\varphi$$

By substituting equation (16) into equation (6), the differential output voltage 238, $D_{A,B}$, can be determined as follows:

$$D_{A,B} = S \times H_{mG1} \times \sin \varphi \quad (18)$$

By substituting equation (17) into equation (11), the differential output voltage 240, $D_{C,D}$, can be determined as follows:

$$D_{C,D} = S \times H_{mG1} \times \sin \varphi \quad (19)$$

Thus, the angular position (i.e., rotation angle 216) $\varphi$, can be calculated at rotation angle determination circuitry 242 by division of the differential output voltages, $D_{A,B}$ and $D_{C,D}$, as follows:

$$\frac{D_{A,B}}{D_{C,D}} = \frac{S \times H_{mG1} \times \sin\varphi}{S \times H_{mG1} \times \cos\varphi} = \tan\varphi \quad (20)$$

Thus, the angular position, i.e., rotation angle 216, of magnet 200 (FIG. 14) can be identified utilizing the differential output voltages, $D_{A,B}$ and $D_{C,D}$, as follows:

$$\varphi = \arctan \frac{D_{A,B}}{D_{C,D}} \quad (21)$$

Figure 17:
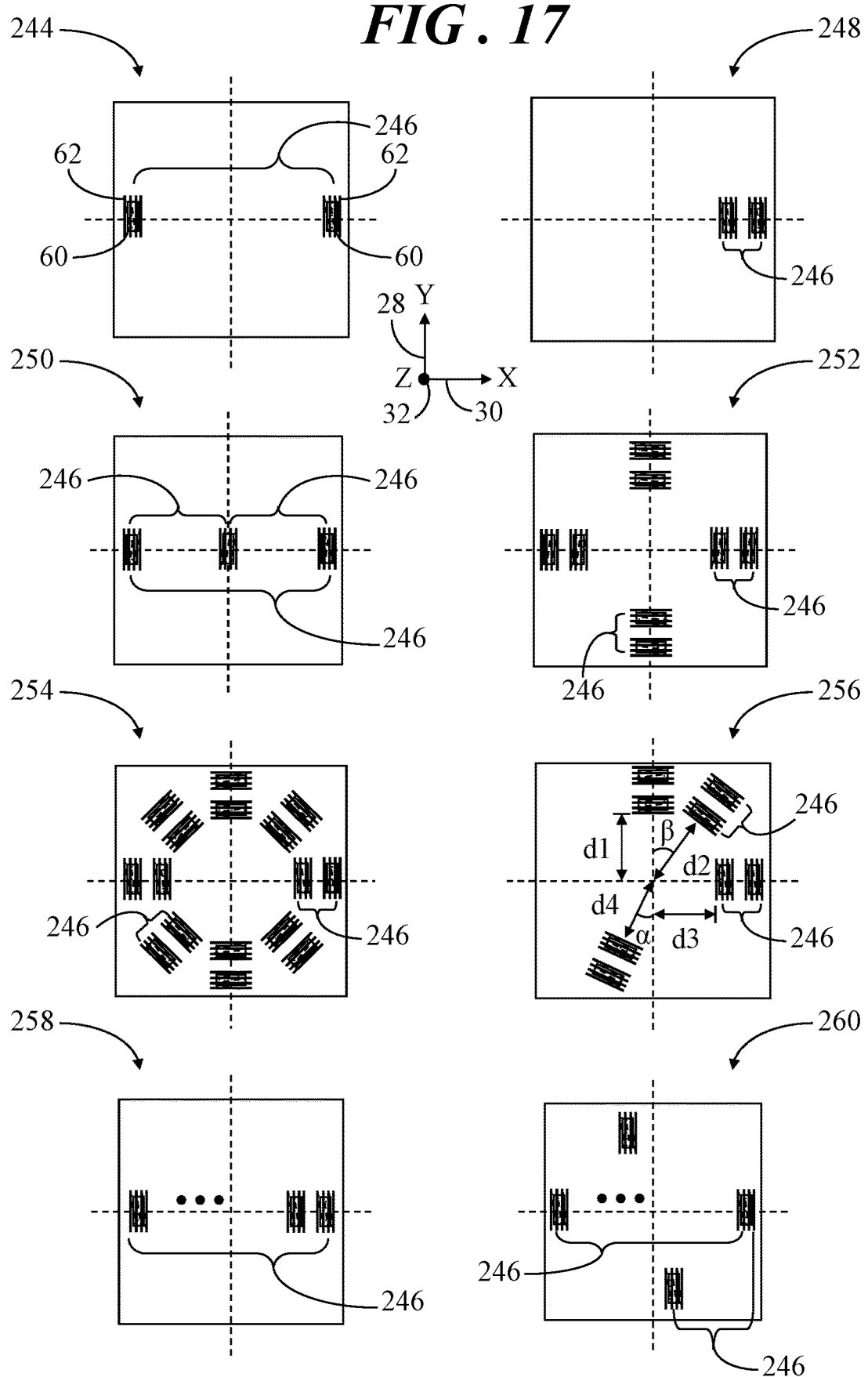
FIG. 17 shows various simplified top views showing positions of gradient units that may alternatively be incorporated into the system of FIG. 16.

Referring now to FIG. 17, FIG. 17 shows various simplified top views showing positions of gradient units that may alternatively be incorporated into the system of FIGS. 14-15. As mentioned previously, alternative embodiments of system 190 may include a multitude of gradient units. Further, these gradient units may be arranged differently. Each of the configurations of gradient units shown in FIG. 17 includes magnetic sense elements 60 with magnetic field sources (e.g., coil structures 62) located proximate to the magnetic sense elements.

Accordingly, FIG. 17 includes a first configuration 244 having two magnetic sense elements 60 with two magnetic field sources 62 that are widely spaced apart along the sensing axis (e.g., X-axis 30) but form a single gradient unit 246. Additionally, a second configuration 248 includes two magnetic sense elements 60 that are closely spaced apart along the sensing axis (e.g., X-axis 30) and form a single gradient unit 246. A third configuration 250 includes three magnetic sense elements 60 that are spaced apart along the sensing axis/X-axis 30. In third configuration 250, one of the magnetic sense elements 60 may be located at the center point and the remaining two magnetic sense elements 60 are spaced on opposite sides of and at an equal distance from the center point. Various pairs of magnetic sense elements 60 can be formed to yield multiple gradient units 246, as shown.

A fourth configuration 252 has four gradient units 246 each separated by 90°. A fifth configuration 254 is shown having eight gradient units 246, each separated by 45°. A sixth configuration 256 is shown having gradient units 246 in which the angles (e.g., α and β) from parallel to the axes and the distances (d1, d2, d3, d4) from the center can be different. In a seventh configuration 258, multiple magnetic sense elements 60 denoted with ellipses that are laterally shifted along the X-axis 30 (sensing axis) with the same distance between each magnetic sense element 60, thereby forming multiple gradient units. In an eighth configuration 260, distances vary and magnetic sense elements 60 can be laterally shifted along X-axis 30 and/or Y-axis 28 to yield gradient units 246. FIG. 17 only shows a few configurations of gradient units. Other configurations may be equivalently applicable.

FIG. 18 shows a simplified partial side view of a system 262 for rotational speed measurement in which magnetic sense elements 60 with magnetic field sources (e.g., coil structures) may be implemented. In this example, system 262 includes a magnetized encoder wheel 264 for generating a magnetic field, although alternative embodiments may implement a ferromagnetic gear wheel or other similar structure. The presented north (N) and south (S) pole configuration shown in FIG. 18 is one example of an encoder wheel.

In this example configuration, magnetic sense elements 60 are configured to measure rotational speed of encoder wheel 264. Thus, magnetic sense elements 60 are aligned with Y-axis 28 to detect external magnetic field 26 along the sensing axis (e.g., Y-axis 28) generated as the alternating magnetic north and south poles of encoder wheel 264 as they pass by during rotation of encoder wheel 264. Each of magnetic sense elements 60 converts the pole-sequence into a sinusoidal-like output voltage, and the rotational speed of encoder wheel 264 may be derived by counting, for example, the zero crossings. A bias magnet (not shown) may be used to adjust the sensitivity and measurement range of magnetic sense elements 60.

The magnetic field sources shown in FIG. 18 are planar coil structures 266 formed in a single conductive layer of the structure shown in FIG. 18. Planar coil structures 266 may yield sufficient field strength of auxiliary magnetic field 64 in a simpler, hence less costly, form factor relative to the three-dimensional coil structures 62 discussed above. However, the three-dimensional coil structures 62 may alternatively be implemented in system 262. Planar coil structures 266 may be energized continuously to provide auxiliary magnetic field 64 along the sensing axis, e.g., Y-axis 28, and thereby compensate for non-sensing axis stray magnetic field 40 (FIG. 5) along the non-sensing axis, e.g., X-axis 30, as discussed in detail above.

FIG. 18 does not show magnetic sense elements 60 in a packaged form and attached to a corresponding structure for simplicity of illustration. Rather, magnetic sense elements 60 are shown displaced away from encoder wheel 264 relative to Z-axis 32 of the three-dimensional coordinate system. In an actual configuration, it should be readily apparent that magnetic sense elements 60 will be packaged and attached to a support structure in suitable proximity to encoder wheel 264. Additionally, three magnetic sense elements 60 are shown for simplicity. These magnetic sense elements 60 may be arranged as gradient units, similar to gradient units 246 (FIG. 17) of third configuration 250 (FIG. 17). Alternatively, output signals from each of magnetic sense elements 60 may be combined via, for example, summation to enhance the accuracy of system 262 to external magnetic field 26.

FIG. 18 only shows a simplified configuration of a rotational speed measurement system. Other configurations may be equivalently applicable. Further, other systems may be envisioned that include magnetic sense elements with magnetic field sources positioned proximate the magnetic sense elements for providing an auxiliary magnetic field along the sensing axis and utilizing the auxiliary magnetic field to compensate for non-sensing axis stray magnetic fields along the non-sensing axis.

FIG. 19 shows a simplified partial side view of another system 268 for rotational speed measurement. System 268 includes many of the structural features described in connection with system 262 (FIG. 18). Thus, a description of those features will not be repeated for brevity. In the configuration of system 268, an unmagnetized passive encoder wheel 270 is implemented, in which case, a bias magnet (not shown) may be used to magnetize the passive ferro magnetic encoder wheel 270.

Embodiments described herein entail magnetic field sensors and systems incorporating the magnetic field sensors for measuring magnetic fields while substantially cancelling stray magnetic fields along one or more axes. An embodiment of a system comprises a magnetic sense element for detecting an external magnetic field along a sensing axis and a magnetic field source proximate the magnetic sense element for providing an auxiliary magnetic field along the sensing axis of the magnetic sense element. The magnetic sense element produces a first output signal having a magnetic field signal component responsive to the external magnetic field, the magnetic field signal component being modulated by an auxiliary magnetic field signal component responsive to the auxiliary magnetic field. The system further comprises a processing circuit coupled with the magnetic sense element, wherein the processing circuit is configured to receive the first output signal, identify from the first output signal an influence of a magnetic interference field on the auxiliary magnetic field signal component, the magnetic interference field being directed along a non-sensing axis of the magnetic sense element, and the processing circuit being further configured to apply a correction factor to the magnetic field signal component of the first output signal to produce a second output signal in which an influence of the magnetic interference field is substantially removed from the magnetic field signal component.

In a system that includes a magnetic sense element for detecting an external magnetic field along a sensing axis, an embodiment of a method comprises energizing a magnetic field source located proximate the magnetic sense element to generate an auxiliary magnetic field along the sensing axis of the magnetic sense element. The magnetic sense element produces a first output signal having a magnetic field signal component responsive to the external magnetic field, the magnetic field signal component being modulated by an auxiliary magnetic field signal component responsive to the auxiliary magnetic field. The method further comprises receiving, at a processing circuit, the first output signal, identifying from the first output signal an influence of a magnetic interference field on the auxiliary magnetic field signal component, the magnetic interference field being directed along a non-sensing axis of the magnetic sense element, and applying a correction factor to the magnetic field signal component of the first output signal to produce a second output signal in which the influence of the magnetic interference field is substantially removed.

Thus, a system includes one or more magnetic field sense elements located in proximity to one or more magnetic field sources, such as a coil structure. The magnetic field source is configured to provide a periodically varying auxiliary magnetic field along the sensing axis of the magnetic field sensor. The periodically varying auxiliary magnetic field thus leads to a periodically varying electrical voltage (or current) response of the magnetic field sensor. The periodically varying electrical voltage (or current) response changes from an expected value depending upon the field strength of a stray magnetic field along a non-sensing axis. Accordingly, the periodically varying auxiliary magnetic field can be used to produce an auxiliary magnetic field signal component that can, in turn, be used to determine the field strength of a stray magnetic field along a non-sensing axis. Knowledge of this field strength can be used to counteract, or otherwise cancel, an adverse signal contribution resulting from the stray magnetic field along a non-sensing axis in order to effectively reduce the number of sensitive axes to produce a single axis magnetoresistive sense element. The magnetic sense element along with magnetic field source (yielding a single axis magnetoresistive sense element) may be incorporated in a gradient unit approach which enables cancellation of an adverse signal contribution resulting from a homogeneous (i.e., uniform) stray magnetic field along the sensing axis. Further, one or more magnetic field sense elements with one or more magnetic field sources can be implemented in various system configurations for purposes of speed and direction sensing, rotation angle sensing, proximity sensing, and the like.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A system comprising:
    a magnetic sense element for detecting an external magnetic field along a sensing axis the external magnetic field exhibiting a first frequency;
    a magnetic field source proximate the magnetic sense element for providing an auxiliary magnetic field along the sensing axis of the magnetic sense element, the auxiliary magnetic field exhibiting a second frequency that is greater than the first frequency, wherein the magnetic sense element produces a first output signal having a magnetic field signal component responsive to the external magnetic field, the magnetic field signal component being modulated by an auxiliary magnetic field signal component responsive to the auxiliary magnetic field; and
    a processing circuit in coupled with the magnetic sense element, wherein the processing circuit is configured to receive the first output signal, identify from the first output signal an influence of a magnetic interference field on the auxiliary magnetic field signal component, the magnetic interference field being directed along a non-sensing axis of the magnetic sense element, and the processing circuit being further configured to apply a correction factor to the magnetic field signal component of the first output signal to produce a second output signal in which an influence of the magnetic interference field is substantially removed from the magnetic field signal component, and the processing circuit comprises:
    a frequency band separation element configured to receive the first output signal and separate the auxiliary magnetic field signal component from the magnetic field signal component in response to the first and second frequencies of the external magnetic field and the auxiliary magnetic field, respectively;
    an extraction element in communication with the frequency band separation element, the extraction element being configured to receive the auxiliary magnetic field signal component and compute a quotient value as a ratio of a first signal magnitude of the auxiliary magnetic field signal component and a second signal magnitude, wherein the first signal magnitude is influenced by the magnetic interference field and the second signal magnitude is an expected value of the first signal magnitude without the magnetic interference field; and
    a compensation element in communication with each of the frequency band separation element and the extraction element, the compensation element being configured to utilize the quotient value to determine the correction factor.

2. The system of claim 1 wherein the magnetic sense element comprises a magnetoresistive sense element.

3. The system of claim 1 wherein the magnetic field source comprises an electrically conductive coil structure.

4. The system of claim 3 wherein the electrically conductive coil structure is a planar coil structure or a three-dimensional coil structure encircling the magnetic sense element.

5. The system of claim 3 further comprising a power supply coupled with the conductive coil structure and configured to provide a periodically time varying current through the conductive coil structure for generating the auxiliary magnetic field as a time varying auxiliary magnetic field.

6. The system of claim 1 wherein the auxiliary magnetic field signal component at the second frequency is characterized by a maximum magnetic field strength generated by the magnetic field source and a minimum magnetic field strength generated by the magnetic field source, and wherein the influence of the magnetic interference field on the auxiliary magnetic field signal component is identified as a change in a sensor response caused by the maximum magnetic field strength and the minimum magnetic field strength.

7. The system of claim 1 wherein the quotient value is distinct for one of a plurality magnetic interference fields along the non-sensing axis.

8. A system comprising:
a first magnetic sense element for detecting an external magnetic field along a sensing axis;
a first magnetic field source proximate the first magnetic sense element for providing an auxiliary magnetic field along the sensing axis of the first magnetic sense element, wherein the first magnetic sense element produces a first output signal having a first magnetic field signal component responsive to the external magnetic field, the first magnetic field signal component being modulated by an auxiliary magnetic field signal component responsive to the auxiliary magnetic field
a second magnetic sense element for detecting the external magnetic field along the sensing axis;
the first magnetic source or a second magnetic field source proximate the second magnetic sense element for providing the auxiliary magnetic field along the sensing axis of the second magnetic sense element, wherein:
the second magnetic sense element produces a third output signal having a second magnetic field signal component responsive to the external magnetic field, the second magnetic field signal component being modulated by the auxiliary magnetic field signal component; and
a processing circuit coupled with the first magnetic sense element, wherein the processing circuit is configured to receive the first output signal, identify from the first output signal an influence of a magnetic interference field on the first auxiliary magnetic field signal component, the magnetic interference field being directed along a non-sensing axis of the first magnetic sense element, and the processing circuit being further configured to apply a correction factor to the magnetic field signal component of the first output signal to produce a second output signal in which an influence of the magnetic interference field is substantially removed from the magnetic field signal component, and wherein the processing circuit is further coupled with the second magnetic sense element and is configured to receive the third output signal, identify from the third output signal the influence of the magnetic interference field on the auxiliary magnetic field signal component, and apply the correction factor to the third output signal to produce a fourth output signal indicative of the second magnetic field signal component in which an influence of the magnetic interference field is substantially removed from the second magnetic field signal component.

9. The system of claim 8 wherein:
the magnetic interference field is a first magnetic interference field;
the first and second magnetic sense elements are subject to a second magnetic interference field along the sensing axis;
the first and second magnetic sense elements are arranged as a gradient unit; and
the processing circuit is configured to produce linear second and fourth output signals and to produce a differential output signal as a difference between the second and fourth output signals, the difference between the second and fourth output signals substantially removing the second magnetic interference field.

10. The system of claim 9 wherein the first and second magnetic sense elements are formed on a substrate, the sensing and non-sensing axes are parallel to a planar surface of the substrate, and the sensing and non-sensing axes are perpendicular to one another.

11. In a system that includes a magnetic sense element for detecting an external magnetic field along a sensing axis, the external magnetic field exhibiting a first frequency, a method comprising:
energizing a magnetic field source located proximate the magnetic sense element to generate an auxiliary magnetic field along the sensing axis of the magnetic sense element, wherein the energizing operation comprises providing a periodic time varying current through the magnetic field source to yield the auxiliary magnetic field as a time varying auxiliary magnetic field at a second frequency that is greater than the first frequency, and wherein the magnetic sense element produces a first output signal having a magnetic field signal component responsive to the external magnetic field, the magnetic field signal component being modulated by an auxiliary magnetic field signal component responsive to the auxiliary magnetic field;
receiving, at a processing circuit, the first output signal;
identifying from the first output signal an influence of a magnetic interference field on the auxiliary magnetic field signal component, the magnetic interference field being directed along a non-sensing axis of the magnetic sense element;
separating, at the processing circuit, the auxiliary magnetic field signal component from the magnetic field signal component in response to the first and second frequencies of the external magnetic field and the auxiliary magnetic field, respectively;
computing a quotient value as a ratio of a first signal magnitude of the auxiliary magnetic field signal component and a second signal magnitude, wherein the first signal magnitude is influenced by the magnetic interference field and the second signal magnitude is an expected value of the first signal magnitude without the magnetic interference field;
utilizing the quotient value to determine a correction factor; and
applying the correction factor to the magnetic field signal component of the first output signal to produce a second output signal in which the influence of the magnetic interference field is substantially removed.

12. The method of claim 11 wherein the auxiliary magnetic field signal component at the second frequency is characterized by a maximum magnetic field strength generated by the magnetic field source and a minimum magnetic field strength generated by the magnetic field source, and wherein the influence of the magnetic interference field on the auxiliary magnetic field signal component is identified as a change in a sensor response caused by the maximum magnetic field strength and the minimum magnetic field strength.

13. A system comprising:
   a magnetoresistive sense element for detecting an external magnetic field along a sensing axis, the external magnetic field exhibiting a first frequency;
   an electrically conductive coil structure proximate the magnetic sense element for providing an auxiliary magnetic field along the sensing axis of the magnetic sense element, the auxiliary magnetic field exhibiting a second frequency that is greater than the first frequency, wherein the magnetoresistive sense element produces a first output signal having a magnetic field signal component responsive to the external magnetic field, the magnetic field signal component being modulated by an auxiliary magnetic field signal component responsive to the auxiliary magnetic field; and
   a processing circuit coupled with the magnetic sense element, wherein the processing circuit is configured to:
   receive the first output signal and separate the auxiliary magnetic field signal component from the magnetic field signal component in response to the first and second frequencies of the external magnetic field and the auxiliary magnetic field, respectively;
   compute a quotient value as a ratio of a first signal magnitude of the auxiliary magnetic field signal component and a second signal magnitude of the auxiliary magnetic field signal component, wherein the first signal magnitude is influenced by a magnetic interference field and the second signal magnitude is an expected value of the first signal magnitude without the magnetic interference field, the magnetic interference field being directed along a non-sensing axis of the magnetoresistive sense element;
   utilize the quotient value to determine a correction factor; and
   apply the correction factor to the magnetic field signal component of the first output signal to produce a second output signal in which an influence of the magnetic interference field is substantially removed from the magnetic field signal component.

14. The system of claim 13 wherein the auxiliary magnetic field signal component at the second frequency is characterized by a maximum magnetic field strength generated by the coil structure and a minimum magnetic field strength generated by the coil structure, and wherein the influence of the magnetic interference field on the auxiliary magnetic field signal component is identified as a change in a sensor response caused by the maximum magnetic field strength and the minimum magnetic field strength.

15. The system of claim 13 wherein the quotient value is distinct for one of a plurality magnetic interference fields along the non-sensing axis.

16. The system of claim 13 wherein the magnetoresistive sense element is a first magnetoresistive sense element, the coil structure is a first coil structure, and the system further comprises:
   a second magnetoresistive sense element for detecting the external magnetic field along the sensing axis; and
   the first coil structure or a second electrically conductive coil structure proximate the second magnetoresistive sense element for providing the auxiliary magnetic field along the sensing axis of the second magnetoresistive sense element, wherein the second magnetoresistive sense element produces a third output signal having a second magnetic field signal component responsive to the external magnetic field, the second magnetic field signal component being modulated by the auxiliary magnetic field signal component, the processing circuit is coupled with the second magnetoresistive sense element, wherein the processing circuit is further configured to receive the third output signal, identify from the third output signal the influence of the magnetic interference field on the auxiliary magnetic field signal component, and apply the correction factor to the third output signal to produce a fourth output signal indicative of the second magnetic field signal component in which an influence of the magnetic interference field is substantially removed.

17. The system of claim 16 wherein:
   the magnetic interference field is a first magnetic interference field;
   the first and second magnetoresistive sense elements are formed on a substrate, the sensing and non-sensing axes are parallel to a planar surface of the substrate, and the sensing and non-sensing axes are perpendicular to one another;
   the first and second magnetoresistive sense elements are subject to a second magnetic interference field along the sensing axis;
   the first and second magnetoresistive sense elements are arranged as a gradient unit; and
   the processing circuit is configured to produce linear second and fourth output signals and to produce a differential output signal as a difference between the second and fourth output signals, the difference between the second and fourth output signals substantially removing the second magnetic interference field.

* * * * *